United States Patent
Do et al.

(10) Patent No.: US 9,947,623 B1
(45) Date of Patent: *Apr. 17, 2018

(54) SEMICONDUCTOR DEVICE COMPRISING A CONDUCTIVE PAD ON A PROTRUDING-THROUGH ELECTRODE

(71) Applicant: Amkor Technology, Inc., Tempe, AZ (US)

(72) Inventors: Won Chul Do, Kyunggi-do (KR); Yong Jae Ko, Gwangju (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/250,397

(22) Filed: Aug. 29, 2016

Related U.S. Application Data

(63) Continuation of application No. 14/615,127, filed on Feb. 5, 2015, now Pat. No. 9,431,323, which is a
(Continued)

(51) Int. Cl.
*H01L 23/538* (2006.01)
*H01L 23/00* (2006.01)
*H01L 21/768* (2006.01)

(52) U.S. Cl.
CPC .... *H01L 23/5384* (2013.01); *H01L 21/76879* (2013.01); *H01L 24/02* (2013.01);
(Continued)

(58) Field of Classification Search
CPC ............. H01L 25/0657; H01L 23/3128; H01L 23/481; H01L 2224/16145
See application file for complete search history.

(56) References Cited

U.S. PATENT DOCUMENTS

| 2,596,993 A | 5/1952 | Gookin |
| 3,435,815 A | 4/1969 | Forcier |

(Continued)

FOREIGN PATENT DOCUMENTS

| DE | 19734794 | 7/1998 |
| EP | 0393997 | 10/1990 |

(Continued)

OTHER PUBLICATIONS

Kim et al., "Application of Through Mold Via (TMV) as PoP base package", 58th ECTC Proceedings, May 2008, Lake Buena Vista, FL, 6 pages, IEEE.

(Continued)

*Primary Examiner* — Dung Le
(74) *Attorney, Agent, or Firm* — McAndrews, Held & Malloy, Ltd.

(57) ABSTRACT

A semiconductor device. For example and without limitation, various aspects of the present disclosure provide a semiconductor device that comprises a semiconductor die comprising an inactive die side and an active die side opposite the inactive die side, a through hole in the semiconductor die that extends between the inactive die side and the active die side where the through hole comprises an inner wall, an insulating layer coupled to the inner wall of the through hole, a through electrode inside of the insulating layer, a dielectric layer coupled to the inactive die side, and a conductive pad coupled to the through electrode.

20 Claims, 14 Drawing Sheets

Related U.S. Application Data continuation of application No. 14/017,797, filed on Sep. 4, 2013, now Pat. No. 8,981,572, which is a continuation of application No. 13/306,685, filed on Nov. 29, 2011, now Pat. No. 8,552,548.

(52) U.S. Cl.
CPC .............. *H01L 24/05* (2013.01); *H01L 24/11* (2013.01); *H01L 2224/0401* (2013.01); *H01L 2224/05083* (2013.01)

(56) References Cited

U.S. PATENT DOCUMENTS

| | | |
|---|---|---|
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,394,712 A | 7/1983 | Anthony |
| 4,417,266 A | 11/1983 | Grabbe |
| 4,451,224 A | 5/1984 | Harding |
| 4,499,655 A | 2/1985 | Anthony |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,729,061 A | 3/1988 | Brown |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,229,647 A | 7/1993 | Gnadinger |
| 5,245,751 A | 9/1993 | Locke et al. |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,268,310 A | 12/1993 | Goodrich et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,353,498 A | 10/1994 | Fillion et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,394,303 A | 2/1995 | Yamaji |
| 5,406,124 A | 4/1995 | Morita et al. |
| 5,410,180 A | 4/1995 | Fuji et al. |
| 5,414,299 A | 5/1995 | Wang et al. |
| 5,417,905 A | 5/1995 | Lemaire et al. |
| 5,424,576 A | 6/1995 | Djennas et al. |
| 5,428,248 A | 6/1995 | Cha |
| 5,432,677 A | 7/1995 | Mowatt et al. |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,576,517 A | 11/1996 | Wojnarowski et al. |
| 5,578,525 A | 11/1996 | Mizukoshi |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,264 A | 3/1997 | Gaul |
| 5,608,265 A | 3/1997 | Kitano et al. |
| 5,608,267 A | 3/1997 | Mahulikar et al. |
| 5,619,068 A | 4/1997 | Benzoni |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita et al. |
| 5,736,432 A | 4/1998 | MacKessy |
| 5,736,448 A | 4/1998 | Saia et al. |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |

(56) References Cited

U.S. PATENT DOCUMENTS

| | | |
|---|---|---|
| 5,769,989 A | 6/1998 | Hoffmeyer et al. |
| 5,770,888 A | 6/1998 | Song et al. |
| 5,776,798 A | 7/1998 | Quan et al. |
| 5,783,861 A | 7/1998 | Son |
| 5,786,238 A | 7/1998 | Pai et al. |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,841,193 A | 11/1998 | Eichelberger |
| 5,844,306 A | 12/1998 | Fujita et al. |
| 5,856,911 A | 1/1999 | Riley |
| 5,859,471 A | 1/1999 | Kuraishi et al. |
| 5,859,475 A | 1/1999 | Freyman et al. |
| 5,866,939 A | 2/1999 | Shin et al. |
| 5,871,782 A | 2/1999 | Choi |
| 5,874,770 A | 2/1999 | Saia et al. |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,937,324 A | 8/1999 | Abercrombie et al. |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,982,632 A | 11/1999 | Mosley et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,020,625 A | 2/2000 | Qin et al. |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,715 A | 7/2000 | Sawada et al. |
| 6,087,722 A | 7/2000 | Lee et al. |
| 6,100,594 A | 8/2000 | Fukui et al. |
| 6,113,474 A | 9/2000 | Shih et al. |
| 6,114,752 A | 9/2000 | Huang et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,168,969 B1 | 1/2001 | Farnworth |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,250 B1 | 2/2001 | Melton et al. |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,214,525 B1 | 4/2001 | Boyko et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,192 B1 | 7/2001 | Natarajan |
| 6,258,629 B1 | 7/2001 | Niones et al. |
| 6,261,918 B1 | 7/2001 | So |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,323,550 B1 | 11/2001 | Martin et al. |
| 6,326,243 B1 | 12/2001 | Suzuya et al. |
| 6,326,244 B1 * | 12/2001 | Brooks .............. H01L 23/04 257/E23.114 |
| 6,326,678 B1 | 12/2001 | Kamezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,365,974 B1 | 4/2002 | Abbott et al. |
| 6,369,447 B2 | 4/2002 | Mori |
| 6,369,454 B1 | 4/2002 | Chung |
| 6,373,127 B1 | 4/2002 | Baudouin et al. |
| 6,379,982 B1 | 4/2002 | Ahn et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,396,148 B1 | 5/2002 | Eichelberger et al. |
| 6,396,153 B2 | 5/2002 | Fillion et al. |
| 6,400,004 B1 | 6/2002 | Fan et al. |
| 6,400,008 B1 | 6/2002 | Farnworth |
| 6,406,934 B1 | 6/2002 | Glenn et al. |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |

(56) References Cited

U.S. PATENT DOCUMENTS

| | | |
|---|---|---|
| 6,429,509 B1 | 8/2002 | Hsuan |
| 6,437,429 B1 | 8/2002 | Su et al. |
| 6,444,499 B1 | 9/2002 | Swiss et al. |
| 6,448,633 B1 | 9/2002 | Yee et al. |
| 6,448,661 B1 | 9/2002 | Kim et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,476,469 B2 | 11/2002 | Hung et al. |
| 6,476,474 B1 | 11/2002 | Hung |
| 6,482,680 B1 | 11/2002 | Khor et al. |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,521,530 B2 | 2/2003 | Peters et al. |
| 6,524,885 B2 | 2/2003 | Pierce |
| 6,534,849 B1 | 3/2003 | Gang |
| 6,545,332 B2 | 4/2003 | Huang |
| 6,545,345 B1 | 4/2003 | Glenn et al. |
| 6,559,525 B2 | 5/2003 | Huang |
| 6,566,168 B2 | 5/2003 | Gang |
| 6,573,461 B2 | 6/2003 | Roeters et al. |
| 6,577,013 B1 | 6/2003 | Glenn et al. |
| 6,583,503 B2 | 6/2003 | Akram et al. |
| 6,593,645 B2 | 7/2003 | Shih et al. |
| 6,603,196 B2 | 8/2003 | Lee et al. |
| 6,608,371 B2 | 8/2003 | Kurashima et al. |
| 6,624,005 B1 | 9/2003 | DiCaprio et al. |
| 6,667,546 B2 | 12/2003 | Huang et al. |
| 6,671,398 B2 | 12/2003 | Reinhorn et al. |
| 6,727,576 B2 | 4/2004 | Hedler et al. |
| 6,730,857 B2 | 5/2004 | Konrad et al. |
| 6,740,964 B2 | 5/2004 | Sasaki |
| 6,780,770 B2 | 8/2004 | Larson |
| 6,831,371 B1 | 12/2004 | Huemoeller et al. |
| 6,838,776 B2 | 1/2005 | Leal et al. |
| 6,845,554 B2 | 1/2005 | Frankowsky et al. |
| 6,853,572 B1 | 2/2005 | Sabharwal |
| 6,873,054 B2 | 3/2005 | Miyazawa et al. |
| 6,905,914 B1 | 6/2005 | Huemoeller et al. |
| 6,919,514 B2 | 7/2005 | Konrad et al. |
| 6,921,975 B2 | 7/2005 | Leal et al. |
| 6,930,256 B1 | 8/2005 | Huemoeller et al. |
| 7,015,075 B2 | 3/2006 | Fay et al. |
| 7,022,609 B2 | 4/2006 | Yamamoto et al. |
| 7,041,534 B2 | 5/2006 | Chao et al. |
| 7,129,158 B2 | 10/2006 | Nakai |
| 7,151,009 B2 | 12/2006 | Kim et al. |
| 7,190,062 B1 | 3/2007 | Sheridan et al. |
| 7,192,807 B1 | 3/2007 | Huemoeller et al. |
| 7,208,838 B2 | 4/2007 | Masuda |
| 7,223,634 B2 | 5/2007 | Yamaguchi |
| 7,242,081 B1 | 7/2007 | Lee |
| 7,247,523 B1 | 7/2007 | Huemoeller et al. |
| 7,272,444 B2 | 9/2007 | Peterson et al. |
| 7,345,361 B2 | 3/2008 | Mallik et al. |
| 7,361,533 B1 | 4/2008 | Huemoeller et al. |
| 7,372,151 B1 | 5/2008 | Fan et al. |
| 7,420,272 B1 | 9/2008 | Huemoeller et al. |
| 7,572,681 B1 | 8/2009 | Huemoeller et al. |
| 7,632,753 B1 | 12/2009 | Rusli et al. |
| 7,692,286 B1 | 4/2010 | Huemoeller et al. |
| 7,714,431 B1 | 5/2010 | Huemoeller et al. |
| 7,723,210 B2 | 5/2010 | Berry et al. |
| 7,777,351 B1 | 8/2010 | Berry et al. |
| 7,839,163 B2 | 11/2010 | Feng et al. |
| 7,843,052 B1 | 11/2010 | Yoo et al. |
| 7,843,072 B1 | 11/2010 | Park et al. |
| 7,902,660 B1 | 3/2011 | Lee et al. |
| 7,932,595 B1 | 4/2011 | Huemoeller et al. |
| 7,977,163 B1 | 7/2011 | Huemoeller et al. |
| 8,188,584 B1 | 5/2012 | Berry et al. |
| 8,211,756 B2 | 7/2012 | Feng et al. |
| 8,324,511 B1 | 12/2012 | Huemoeller et al. |
| 8,390,130 B1 | 3/2013 | Hiner et al. |
| 8,440,554 B1 | 5/2013 | Hiner et al. |
| 8,487,445 B1 | 7/2013 | Do et al. |
| 8,552,548 B1 | 10/2013 | Do et al. |
| 8,981,572 B1 * | 3/2015 | Do .................... H01L 23/481 257/698 |
| 2001/0008305 A1 | 7/2001 | McLellan et al. |
| 2001/0011654 A1 | 8/2001 | Schmidt et al. |
| 2001/0012704 A1 | 8/2001 | Eldridge |
| 2001/0014538 A1 | 8/2001 | Kwan et al. |
| 2002/0017710 A1 | 2/2002 | Kurashima et al. |
| 2002/0024122 A1 | 2/2002 | Jung et al. |
| 2002/0027297 A1 | 3/2002 | Ikenaga et al. |
| 2002/0030245 A1 | 3/2002 | Hanaoka et al. |
| 2002/0061642 A1 | 5/2002 | Haji et al. |
| 2002/0140061 A1 | 10/2002 | Lee |
| 2002/0140068 A1 | 10/2002 | Lee et al. |
| 2002/0163015 A1 | 11/2002 | Lee et al. |
| 2003/0013232 A1 | 1/2003 | Towle et al. |
| 2003/0030131 A1 | 2/2003 | Lee et al. |
| 2003/0038344 A1 | 2/2003 | Palmer et al. |
| 2003/0064548 A1 | 4/2003 | Lsaak |
| 2003/0073265 A1 | 4/2003 | Hu et al. |
| 2003/0134455 A1 | 7/2003 | Cheng et al. |
| 2003/0207566 A1 | 11/2003 | Forbes et al. |
| 2004/0004293 A1 | 1/2004 | Murayama |
| 2004/0026781 A1 | 2/2004 | Nakai |
| 2004/0046244 A1 | 3/2004 | Nakamura et al. |
| 2004/0056277 A1 | 3/2004 | Kamezos |
| 2004/0061212 A1 | 4/2004 | Kamezos |
| 2004/0061213 A1 | 4/2004 | Kamezos |
| 2004/0063242 A1 | 4/2004 | Kamezos |
| 2004/0063246 A1 | 4/2004 | Kamezos |
| 2004/0113260 A1 | 6/2004 | Sunohara et al. |
| 2004/0192033 A1 | 9/2004 | Hara |
| 2004/0251554 A1 | 12/2004 | Masuda |
| 2005/0029630 A1 | 2/2005 | Matsuo |
| 2005/0046002 A1 | 3/2005 | Lee et al. |
| 2005/0104181 A1 | 5/2005 | Lee et al. |
| 2005/0242425 A1 | 11/2005 | Leal et al. |
| 2005/0263869 A1 | 12/2005 | Tanaka et al. |
| 2005/0269696 A1 | 12/2005 | Ochiai |
| 2005/0282314 A1 | 12/2005 | Lo et al. |
| 2007/0007639 A1 | 1/2007 | Fukazawa |
| 2007/0273049 A1 | 11/2007 | Khan et al. |
| 2007/0290376 A1 | 12/2007 | Zhao et al. |
| 2008/0136038 A1 | 6/2008 | Savastiouk et al. |
| 2008/0230887 A1 | 9/2008 | Sun et al. |
| 2008/0277799 A1 | 11/2008 | Benson et al. |
| 2009/0020864 A1 | 1/2009 | Pu et al. |
| 2009/0039527 A1 | 2/2009 | Chan et al. |
| 2009/0115026 A1 | 5/2009 | Gerber et al. |
| 2010/0008058 A1 | 1/2010 | Saen et al. |
| 2012/0018868 A1 | 1/2012 | Oganesian et al. |
| 2012/0098106 A1 | 4/2012 | Aoki et al. |

FOREIGN PATENT DOCUMENTS

| | | |
|---|---|---|
| EP | 0459493 | 12/1991 |
| EP | 0720225 | 7/1996 |
| EP | 0720234 | 7/1996 |
| EP | 0794572 | 9/1997 |
| EP | 0844665 | 5/1998 |
| EP | 0936671 | 8/1999 |
| EP | 0989608 | 3/2000 |
| EP | 1032037 | 8/2000 |
| JP | 55-163868 | 12/1980 |
| JP | 57-045959 | 3/1982 |
| JP | 59-208756 | 11/1984 |
| JP | 59-227143 | 12/1984 |
| JP | 60-01 0756 | 1/1985 |
| JP | 60-116239 | 6/1985 |
| JP | 60-195957 | 10/1985 |
| JP | 60-231349 | 11/1985 |
| JP | 61-039555 | 2/1986 |
| JP | 62-009639 | 1/1987 |
| JP | 63-033854 | 2/1988 |
| JP | 63-067762 | 3/1988 |
| JP | 63-188964 | 8/1988 |

(56) References Cited

FOREIGN PATENT DOCUMENTS

| | | |
|---|---|---|
| JP | 63-205935 | 8/1988 |
| JP | 63-233555 | 9/1988 |
| JP | 63-249345 | 10/1988 |
| JP | 63-289951 | 11/1988 |
| JP | 63-316470 | 12/1988 |
| JP | 64-054749 | 3/1989 |
| JP | 01-106456 | 4/1989 |
| JP | 01-175250 | 7/1989 |
| JP | 01-205544 | 8/1989 |
| JP | 01-251747 | 10/1989 |
| JP | 02-129948 | 5/1990 |
| JP | 03-069248 | 7/1991 |
| JP | 03-177060 | 8/1991 |
| JP | 04-098864 | 3/1992 |
| JP | 05-129473 | 5/1993 |
| JP | 05-166992 | 7/1993 |
| JP | 05-283460 | 10/1993 |
| JP | 06-092076 | 4/1994 |
| JP | 06-140563 | 5/1994 |
| JP | 06-260532 | 9/1994 |
| JP | 07-297344 | 11/1995 |
| JP | 07-312405 | 11/1995 |
| JP | 08-064634 | 3/1996 |
| JP | 08-083877 | 3/1996 |
| JP | 08-125066 | 5/1996 |
| JP | 08-222682 | 8/1996 |
| JP | 08-306853 | 11/1996 |
| JP | 09-008205 | 1/1997 |
| JP | 09-008206 | 1/1997 |
| JP | 09-008207 | 1/1997 |
| JP | 09-092775 | 4/1997 |
| JP | 09-293822 | 11/1997 |
| JP | 10-022447 | 1/1998 |
| JP | 10-163401 | 6/1998 |
| JP | 10-199934 | 7/1998 |
| JP | 10-256240 | 9/1998 |
| JP | 2000-150765 | 5/2000 |
| JP | 2000-556398 | 10/2000 |
| JP | 2001-060648 | 3/2001 |
| JP | 2002-043497 | 2/2002 |
| KR | 1994-0001979 | 1/1994 |
| KR | 10-0220154 | 6/1999 |
| KR | 2002-0049944 | 6/2002 |
| WO | 99/56316 | 11/1999 |
| WO | 99/67821 | 12/1999 |

OTHER PUBLICATIONS

Scanlan, "Package-on-package (PoP) with Through-mold Vias", Advanced Packaging, Jan. 2008, 3 pages, vol. 17, Issue 1, PennWell Corporation.

Huemoeller et al., "Integrated Circuit Film Substrate Having Embedded Conductive Patterns and Vias", U.S. Appl. No. 10/261,868, filed Oct. 1, 2002.

Berry et al., "Direct-write Wafer Level Chip Scale Package", U.S. Appl. No. 11/289,826, filed Nov. 29, 2005.

Do et al., U.S. Appl. No. 14/017,797 "Conductive Pad on Protruding Through Electrode Semiconductor Device and Method of Manufacturing", U.S. Appl. No. 14/017,797, filed Sep. 4, 2013.

* cited by examiner

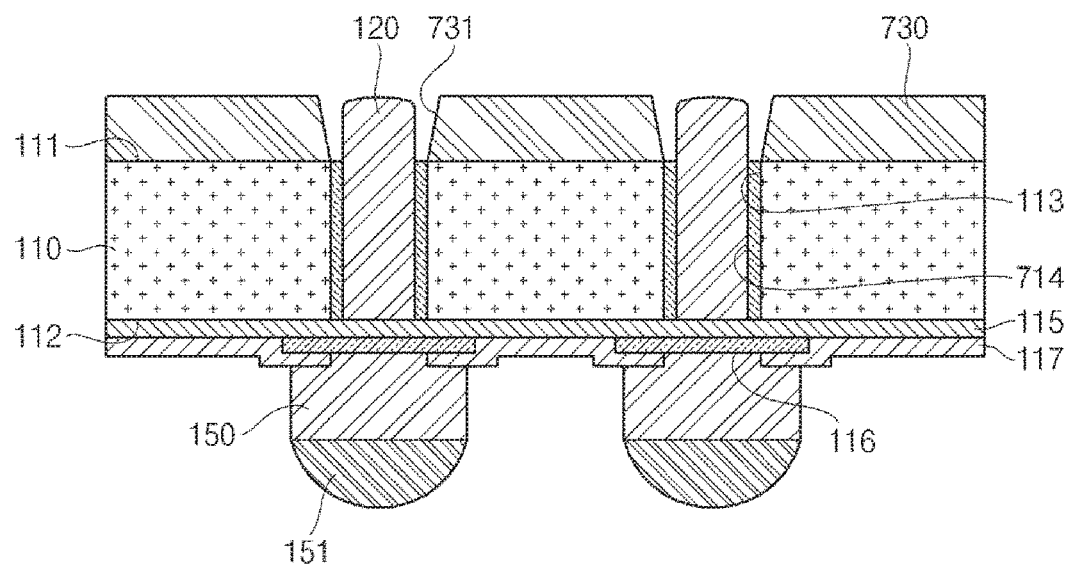
FIG. 11D1
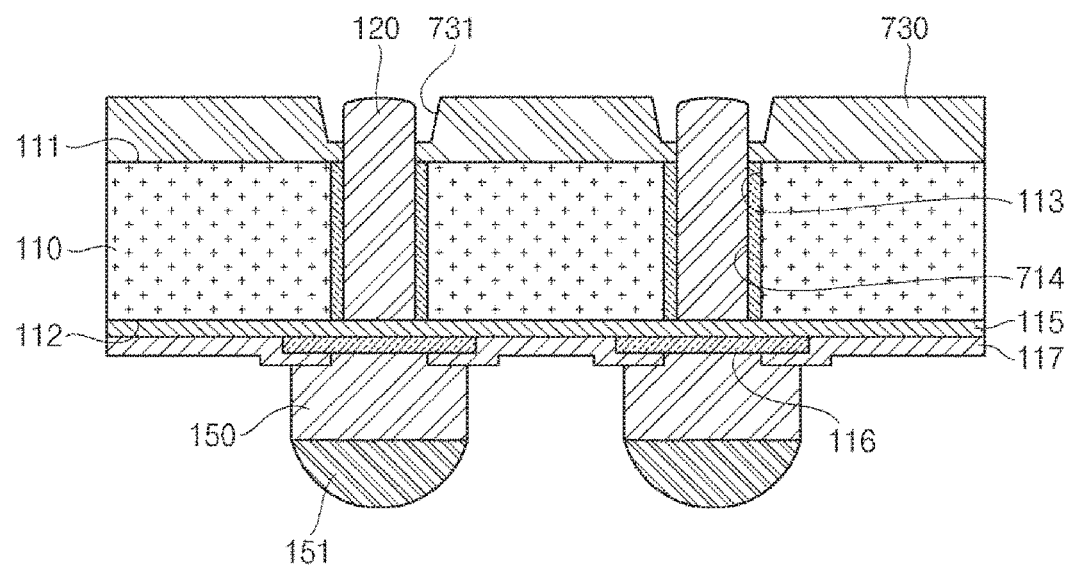
FIG. 11D2

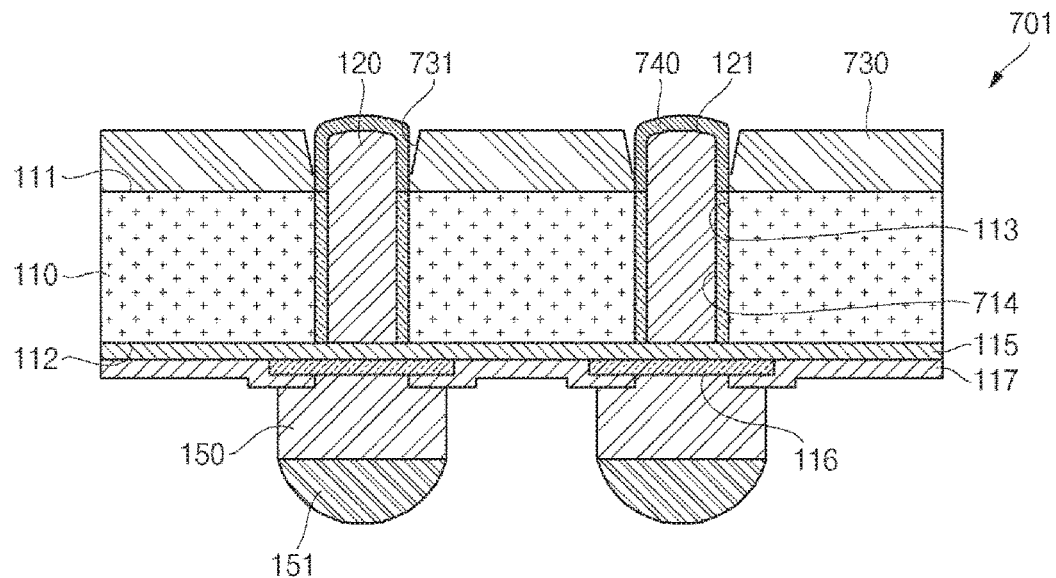
FIG. 11E1
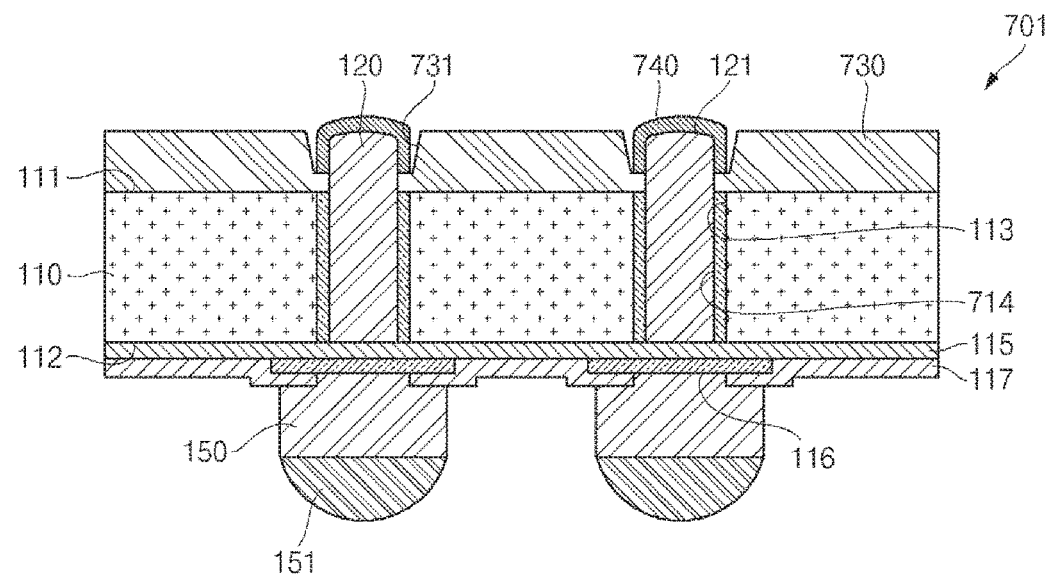
FIG. 11E2

SEMICONDUCTOR DEVICE COMPRISING A CONDUCTIVE PAD ON A PROTRUDING-THROUGH ELECTRODE

CROSS-REFERENCE TO RELATED APPLICATIONS/INCORPORATION BY REFERENCE

The present application is a CONTINUATION of U.S. patent application Ser. No. 14/615,127, filed Feb. 5, 2015, issuing as U.S. Pat. No. 9,431,323, entitled "CONDUCTIVE PAD ON PROTRUDING THROUGH ELECTRODE SEMICONDUCTOR DEVICE AND METHOD OF MANUFACTURING," which is a CONTINUATION of U.S. patent application Ser. No. 14/017,797, filed Sep. 4, 2013, now U.S. Pat. No. 8,981,572, entitled "CONDUCTIVE PAD ON PROTRUDING THROUGH ELECTRODE SEMICONDUCTOR DEVICE AND METHOD OF MANUFACTURING," which is a CONTINUATION of U.S. patent application Ser. No. 13/306,685, filed Nov. 29, 2011, now U.S. Pat. No. 8,552,548, entitled "CONDUCTIVE PAD ON PROTRUDING THROUGH ELECTRODE SEMICONDUCTOR DEVICE".

The above-identified applications are hereby incorporated herein by reference in their entirety.

TECHNICAL FIELD

The present application relates to a semiconductor device and a method of manufacturing the semiconductor device.

BACKGROUND

In the Information Technology (IT) industry, requirements for semiconductor devices have changed into small size and convenience in response to consumers' demands, and thus semiconductor devices are being changed to be miniaturized and modularized. Such changes are contributive to developing techniques for manufacturing the devices and require innovative process techniques.

A representative example of the semiconductor devices is a System In Package (SIP) that satisfies the aforementioned changed requirements. Here, the SIP is manufactured by putting semiconductor dies having their respective functions into a single device or stacking devices to produce a module.

Of late, as a method of stacking identical or different semiconductor dies, which is the core technology of the SIP, a Through-Silicon-Vias (TSV) process of connecting semiconductor dies by forming through holes in silicon has been in development, rather than an existing wire connection method. Here, laser drilling, wet etching, dry etching and the like are known as a technique for forming through holes for the TSV process. However, the TSV process is relatively complex.

BRIEF DESCRIPTION OF THE DRAWINGS

FIGS. 11A, 11B, 11C, 11D1, 11D2, 11E1, and 11E2 are sequential cross-sectional views of a method of manufacturing a semiconductor device according to another embodiment.

In the following description, the same or similar elements are labeled with the same or similar reference numbers.

DETAILED DESCRIPTION

Figure 1A:
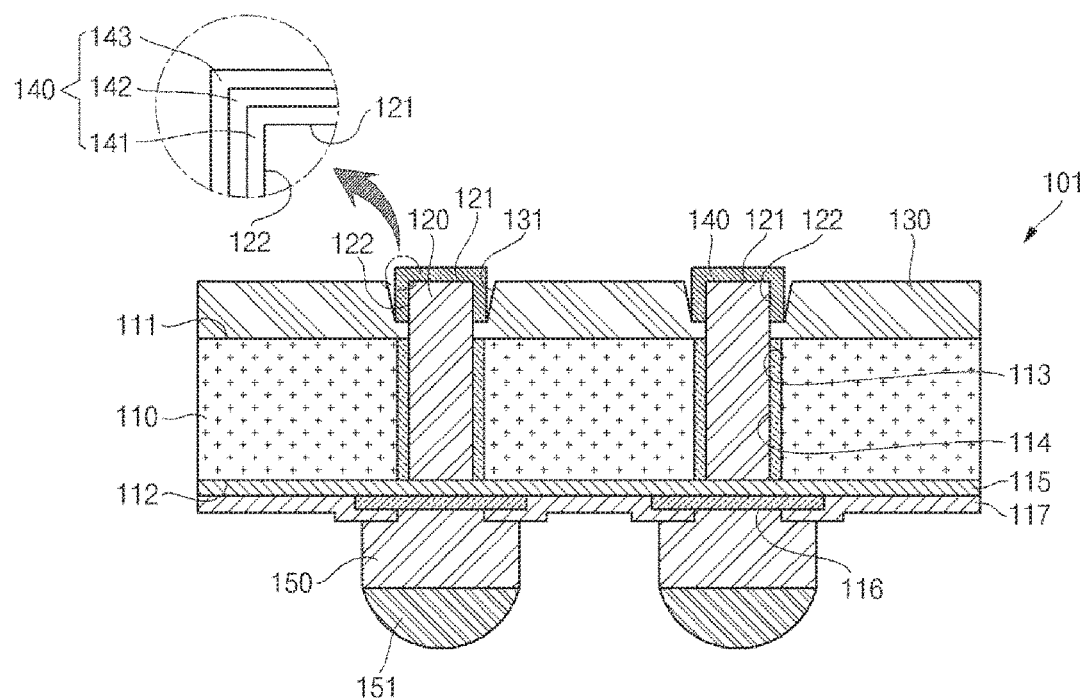
FIGS. 1A and 1B illustrate cross-sectional views of a semiconductor device according to various embodiments.
Figure 1B:
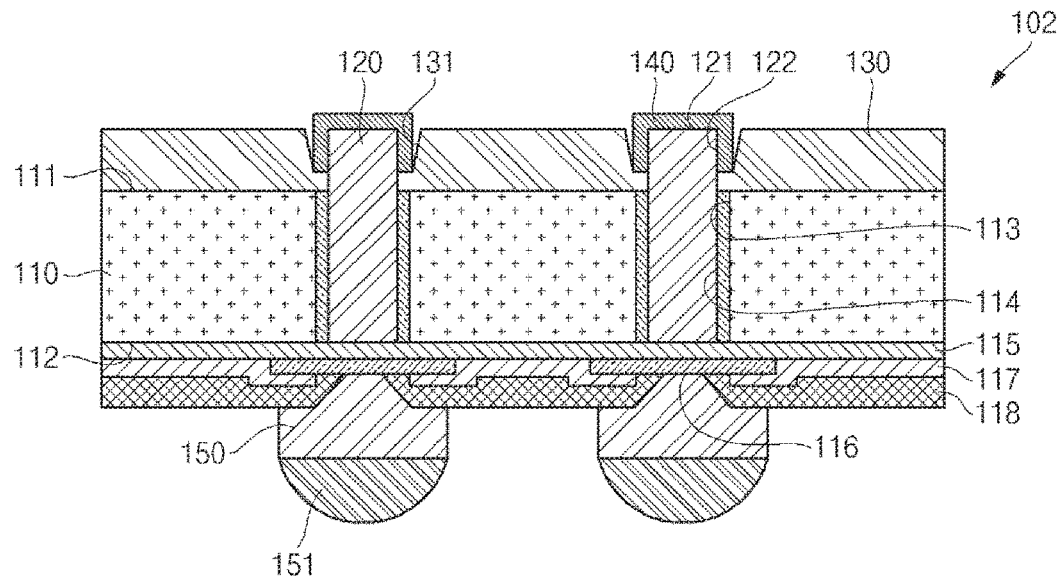

Referring to FIGS. 1A and 1B, cross-sectional views of a semiconductor device according to various embodiments are illustrated.

As shown in FIG. 1A, a semiconductor device 101 includes a semiconductor die 110, a through electrode 120, a dielectric layer 130, a conductive pad 140, and a conductive bump 150.

The semiconductor die 110 includes a substantially planar first surface 111, a substantially planar second surface 112 opposing the first surface 111. Also, the semiconductor die 110 further includes a through hole 113 penetrating the first surface 111 and the second surface 112. Also, the semiconductor die 110 further includes an insulating layer 114 on the inner wall of the through hole 113.

Furthermore, the semiconductor die 110 includes an active region 115 disposed on the second surface 112, a bond pad 116 formed on the active region 115, and another insulating layer 117 covering the circumference of the bond pad 116 and the active region 115. The first surface 111 is sometimes called the inactive surface of the semiconductor die 110 whereas the second surface 112 is sometimes called the active surface of the semiconductor die 110.

The insulating layer 114 serves to prevent the through electrode 120 from being electrically shorted to the semiconductor die 110, and the outer insulating layer 117 provides appropriate protection for the active region 115 from external foreign substances. Those insulating layers 114 and 117 may be formed of any one selected from the group consisting of silicon oxide, silicon nitride, polymer and equivalents thereof. However, in other embodiments, the kinds of insulating layers 114 and 117 are not limited.

The through electrode 120 is provided inside the through hole 113, that is, inside the insulating layer 114. The through electrode 120 is substantially formed in the through hole 113, and extends and protrudes upwardly to a predetermined length through and above the first surface 111. Here, the through electrode 120 extending through and protruding above the first surface 111 includes a top surface 121 and both side surfaces 122, and the top surface 121 is substantially planar. The exposed side surfaces 122 are sometimes called an exposed sidewall 122 of the through electrode 120, i.e., the portion of the sidewall of the through electrode 120 exposed from the dielectric layer 130.

The through electrode 120 may be formed of any one of copper, tungsten, aluminum, gold, silver, and equivalents thereof in general, but the materials of the through electrode 120 is not limited thereto. Furthermore, the through electrode 120 may further include a barrier or seed layer (not shown) disposed on the inner wall of the insulating layer 114.

The dielectric layer 130 is disposed on the first surface 111 of the semiconductor die 110 and has a predetermined thickness. Also, the dielectric layer 130 may have an opening 131 in a region corresponding to the through electrode 120. This opening 131 may have an inclined sectional shape. That is, the opening 131 may have a relatively small lower region and a relatively wide upper region.

Of course, the through electrode 120 penetrates the opening 131, and extends and protrudes upwardly to a predetermined length. In general, the length (or thickness) of the through electrode 120 extending and protruding upwardly from the first surface 111 of the semiconductor die 110 may be smaller than, equal to, or greater than the maximum thickness of the dielectric layer 130. In other words, the maximum thickness of the dielectric layer 130 may be greater than, equal to, or smaller than the length (or thickness) of the through electrode 120 extending and protruding upwardly from the first surface 111 of the semiconductor die 110.

Also, since the opening 131 is formed in part of the dielectric layer 130, the first surface 111 of the semiconductor die 110 is not exposed through the opening 131. That is, the opening 131 does not fully penetrate the dielectric layer 130 but is formed in part of the dielectric layer 130.

Here, the dielectric layer 130 may be formed of at least one selected from the group consisting of Poly Benz Oxazole(PBO), PolyImide(PI), Benzo Cyclo Butene(BCB), BismaleimideTriazine(BT), phenolic resin, epoxy, Silicone, Si3N4, SiO2, and equivalents thereof, but the material of the dielectric layer 130 is not limited thereto. Also, even though a single dielectric layer 130 is illustrated in the drawing, multiple dielectric layers 130 may be used.

The conductive pad 140 includes a first electroless plating layer 141, a second electroless plating layer 142, and a third electroless plating layer 143. The first electroless plating layer 141 roughly surrounds the through electrode 120 inside the opening 131. That is, the first electroless plating layer 141 surrounds the top surface 121 and both side surfaces 122 of the through electrode 120 exposed within the opening 131. The second electroless plating layer 142 surrounds the first electroless plating layer 141. Also, the third electroless plating layer 143 surrounds the second electroless plating layer 142. Also, the lower ends of the first, second and third electroless plating layers 141, 142 and 143 may or may not contact the surface of the opening 131.

The first electroless plating layer 141 may be formed of nickel or equivalents thereof in general, but the material of the first electroless plating layer 141 is not limited thereto. The second electroless plating layer 142 may be palladium or equivalents thereof, but the material of the second electroless plating layer 142 is not limited thereto. Furthermore, the third electroless plating layer 143 may be formed of gold or equivalents thereof, but the material of the third electroless plating layer 143 is not limited thereto.

Here, the third electroless plating layer 143 suppresses the oxidation of the through electrode 120. Also, the first electroless plating layer 141 and the second electroless plating layer 142 suppress interaction between the through electrode 120 and the third electroless plating layer 143. The second electroless plating layer 142 may not be formed in some cases.

In general, such a conductive pad 140 protrudes upwardly with a predetermined thickness or is exposed through the surface of the dielectric layer 130. Thus, the conductive pad 140 serves to facilitate the stacking of a plurality of semiconductor devices 101.

The conductive bump 150 is formed on the bond pad 116, and extends downwardly from the second surface 112. Here, the through electrode 120, the active region 115, and the bond pad 116 may be electrically connected.

The conductive bump 150 has a diameter greater than the diameter of the through electrode 120, thus allowing the conductive bump 150 to be stably mounted on an external device. Furthermore, the conductive bump 150 may come into contact with the insulating layer 117 by having a relatively great diameter. That is, the insulating layer 117 may be interposed between the bond pad 116 and the conductive bump 150.

The conductive bump 150 may be formed of the same material as the through electrode 120. Additionally, the conductive bump 150 may be formed of a material such as solder (SnPb, SnAg) or the like. Furthermore, in one embodiment, a solder cap 151 is formed on the conductive bump 150, however, the solder cap 151 is not an essential element. Of course, in a case where there is a solder cap 151, the semiconductor device 101 can be more easily mounted on an external device.

In such a manner, the semiconductor device 101 according to an embodiment has the conductive pad 140 formed by an electroless plating method, and thus seed metal is not required, and there is no need for a high-temperature sputtering process for the formation of seed metal.

As shown in FIG. 1B, a semiconductor device 102 according to an embodiment includes another insulating layer 118 on the surface of the insulating layer 117. Substantially, the insulating layer 118 also covers a predetermined region of the bond pad 116. Furthermore, a predetermined region of the conductive bump 150 also contacts the insulating layer 118. Thus, the insulating layers 117 and 118 may be interposed between the bond pad 116 and the conductive bump 150.

The insulating layer 118 may be substantially formed of any one selected from the group consisting of Poly Benz Oxazole(PBO), PolyImide(PI), Benzo Cyclo Butene(BCB), BismaleimideTriazine(BT), phenolic resin, epoxy, Silicone, Si3N4, SiO2, and equivalents thereof, but the material of the insulating layer 118 is not limited thereto.

Accordingly, in the semiconductor device 102 according to this embodiment, the insulating layer 118 can efficiently absorb stress acting on the conductive bump 150. Thus, cracking between the bond pad 116 and the conductive bump 150 is efficiently prevented.

Meanwhile, even though the insulating layer 118 is not described in the following embodiments, those of skill in the art will understand that the insulating layer 118 is applied to each embodiment in other examples.

Figure 2:
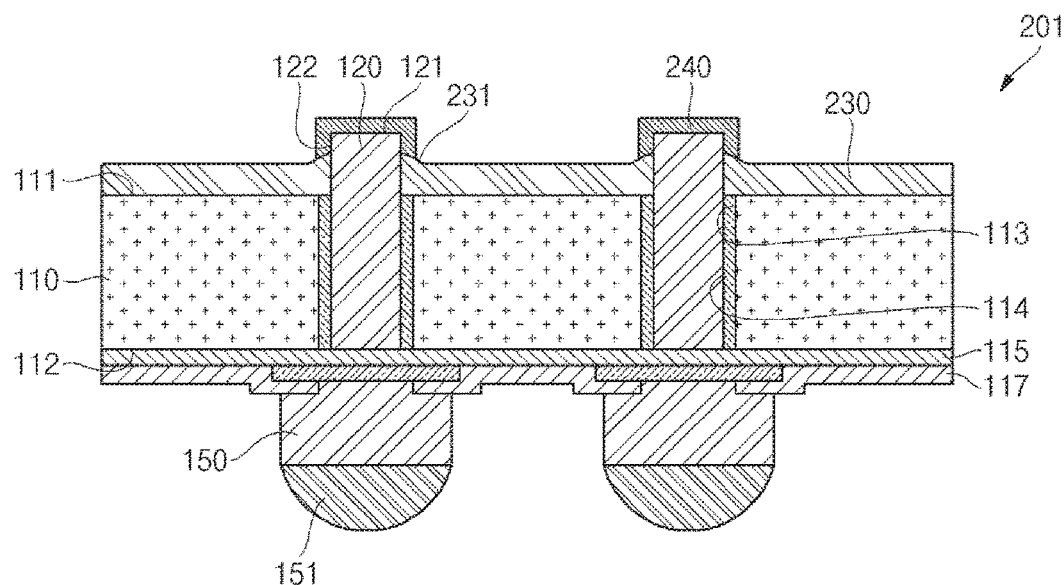
FIG. 2 illustrates a cross-sectional view of a semiconductor device according to another embodiment.

Referring to FIG. 2, a cross-sectional view of a semiconductor device 201 according to another embodiment is illustrated. As shown in FIG. 2, the semiconductor device 201 according to another embodiment is similar to the semiconductor device 101 shown in FIG. 1A, and thus only the significant differences will be described.

As shown in FIG. 2, a dielectric layer 230 does not having an opening, and instead, may have a slightly protruding projection 231. That is, the through electrode 120 extends and protrudes upwardly to a predetermined length through the slight projection 231 rather than an opening. Accordingly, the thickness (or length) of the through electrode 120 substantially extending from the first surface 111 of the semiconductor die 110 may be slightly greater than the thickness of the dielectric layer 230.

Furthermore, a conductive pad 240 is formed by an electroless plating method on the through electrode 120 extending and protruding upwardly to a predetermined length through the projection 231 of the dielectric layer 230. That is, the conductive pad 240 includes a first electroless plating layer surrounding the top surface 121 and both side surfaces 122 of the through electrode 120 and disposed on the surface of the dielectric layer 230, a second electroless plating layer covering the first electroless plating layer, and a third electroless plating layer covering the second electroless plating layer.

Here, the top surface of the conductive pad 240 has a substantially planar shape. The conductive pad 240 may or may not come into contact with the projection 231 of the dielectric layer 230. Here, the first, second and third electroless plating layers are similar to the layers 141, 142, 143 as discussed above in reference to semiconductor device 101, and thus a detailed description thereof is omitted.

Meanwhile, the semiconductor device 201 is manufactured by exposing the through electrode 120 by applying a blanket process to the dielectric layer 230, and then applying a plating process to the top surface 121 and both side surfaces 122 of the exposed through electrode 120. Here, the blanket process renders the dielectric layer 230 the thickest in a region (the projection 231) corresponding to the through electrode 120, and gradually thinner as it is distanced from the through electrode 120.

Thus, there is no need to form an opening in the dielectric layer 230 of the semiconductor device 201, and this simplifies a manufacturing process. Here, the blanket process means wet or dry etching performed upon the entire top surface of the dielectric layer 230.

Figure 3:
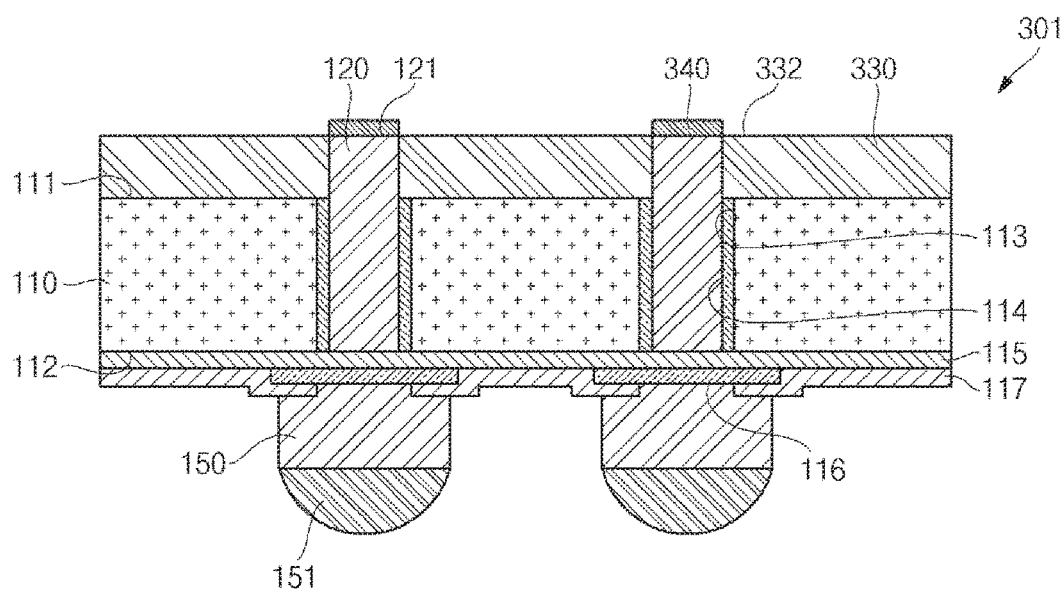
FIG. 3 illustrates a cross-sectional view of a semiconductor device according to another embodiment.

Referring to FIG. 3, a cross-sectional view of a semiconductor device 301 according to another embodiment is illustrated. As shown in FIG. 3, the semiconductor device 301 according to another embodiment is similar to the semiconductor device 201 illustrated in FIG. 2, and thus only the significant differences will now be described.

As shown in FIG. 3, a dielectric layer 330 does not have an opening or a protrusion. That is, the top surface 332 of the dielectric layer 330 may be in the same plane as the top surface 121 of the through electrode 120. Furthermore, a conductive pad 340 is formed on only the top surface 121 of the through electrode 120. That is, the conductive pad 340 is not formed on the sidewall of the through electrode 120, and thus the conductive pad 340 has a substantially planar shape. Here, the top surface 121 of the through electrode 120 has a substantially planar shape.

The semiconductor device 301 is manufactured by exposing the through electrode 120 through a chemical mechanical polishing (CMP) to the dielectric layer 330, and applying a plating process to the top surface 121 of the exposed through electrode 120. Here, by the CMP process, the top surface 121 of the through electrode 120 and the top surface 332 of the dielectric layer 330 are all in the same plane.

Referring to FIGS. 4A through 4E, a method of manufacturing the semiconductor device 101 of FIG. 1A according to another embodiment is illustrated. The manufacturing method of the semiconductor device 101 according to another embodiment includes forming a through electrode, etching a semiconductor die, forming a dielectric layer, forming an opening, and forming a conductive pad.

Figure 4A:
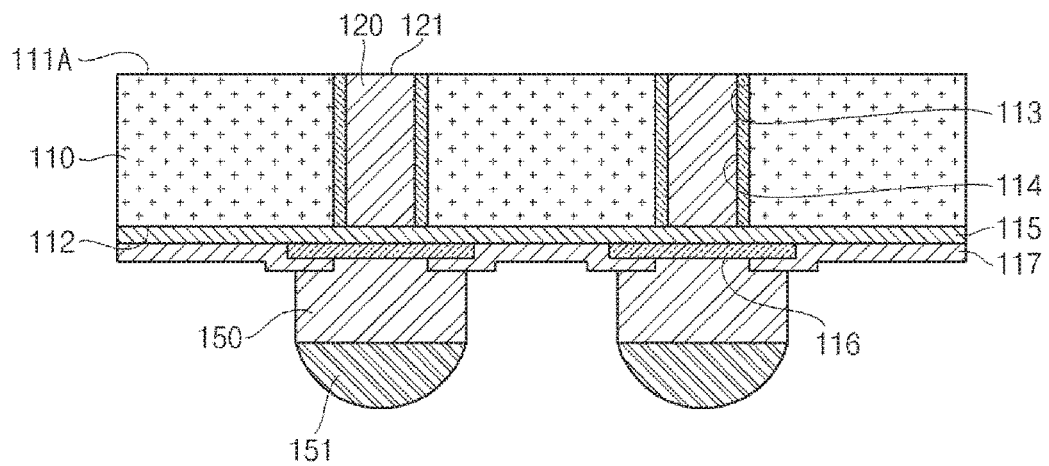
FIGS. 4A, 4B, 4C, 4D, and 4E illustrate sequential cross-sectional views of a method of manufacturing a semiconductor device according to another embodiment.

As shown in FIG. 4A, in the forming a through electrode, a through hole 113 is formed in a semiconductor die 110 having a first surface 111A and a second surface 112 opposing the first surface 111A, and an insulating layer 114 is formed on the inner wall of the through hole 113. Thereafter, a through electrode 120 is formed inside the insulating layer 114.

Here, the through hole 113 is formed by any one of laser drilling, wet etching, dry etching, or equivalent methods thereof, but the method for forming the through hole 113 is not limited thereto. However, the laser drilling, unlike wet etching or dry etching, does not require a mask manufacturing process, a photo-process or the like, and allows the length and width of the through hole 113 to be set relatively easily.

Furthermore, the insulating layer 114 may be formed of silicon oxide (SiOx) or silicon nitride (SiNx) by using a chemical vapor deposition (CVD) method or may be formed of a polymer by using a spin coating method or a sublimation method. However, the method for forming the insulating layer 114 is not limited to the described ones.

Furthermore, the through electrode 120 may be formed of any one selected from the group consisting of copper, tungsten, aluminum, gold, silver or equivalents thereof, but the material of the through electrode 120 is not limited thereto.

Substantially, before the through electrode 120 is formed, a barrier and/or seed layer (not shown) may be formed on the inner wall of the through hole 113 (i.e., the inner wall of the insulating layer 114). Furthermore, the through electrode 120 may be formed of an electroplating process or an electroless plating process.

Furthermore, a conductive bump 150 is formed on the bond pad 116. Here, the conductive bump 150 has a greater diameter than that the through electrode 120. In some cases, a solder cap 151 may be formed on the conductive bump 150.

Also, the top surface 121 of the through electrode 120 may be formed to be in the same plane as the first surface 111A of the semiconductor die 110. Substantially, the first surface 111A of the semiconductor die 110 may be formed through back-grinding such that the top surface 121 of the through electrode 120 is exposed externally through the first surface 111A of the semiconductor die 110.

Due to the back-grinding, the top surface 121 of the through electrode 120 is substantially planar. Furthermore, a region removed by the back-grinding is an inactive region other than an active region 115, and the removal thereof does not have any influence on the operation of the semiconductor die 110. Reference numeral 117 in the drawing indicates another insulating layer covering the active region 115 and the circumference of the bond pad 116.

Figure 4B:
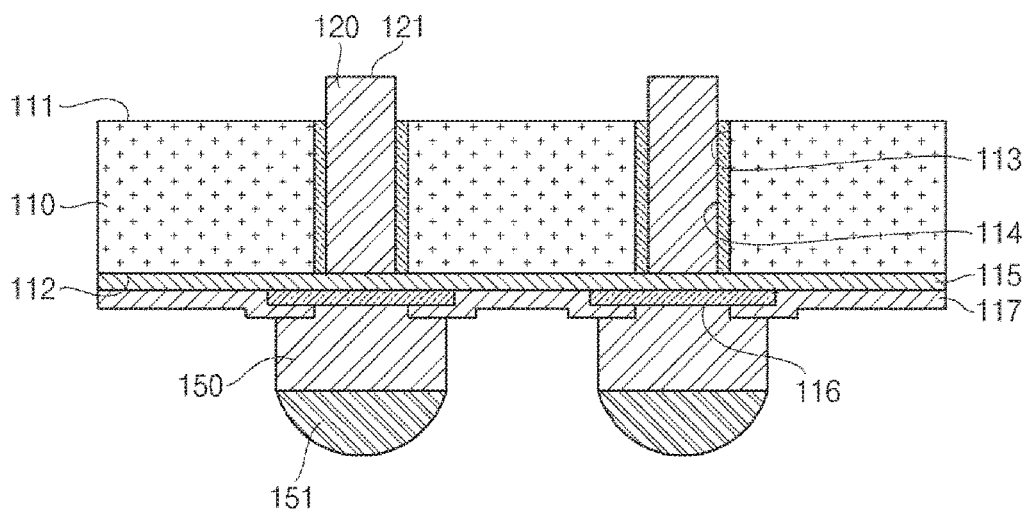

As shown in FIG. 4B, in the etching of the semiconductor die, the first surface 111A (FIG. 4A) of the semiconductor die 110 is removed to a predetermined depth by dry etching or wet etching to form the first surface 111 (FIG. 4B). Here, an etchant used in the dry etching or the wet etching affects only the semiconductor die 110 and the insulating layer 114, and has no influence on the through electrode 120. Accordingly, this etching provides a portion of the through electrode 120 extending and protruding upwardly to a predetermined length through the semiconductor die 110 and the insulating layer 114.

Figure 4C:
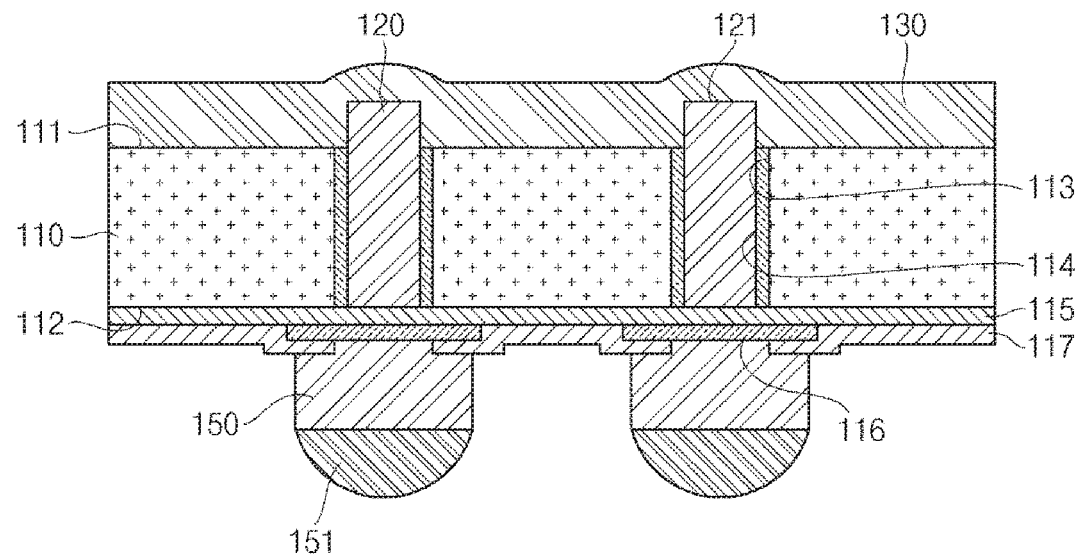

As shown in FIG. 4C, in the forming a dielectric layer, the first surface 111 of the semiconductor die 110 is coated with a dielectric layer 130 with a sufficient thickness to cover the through electrode 120. The dielectric layer 130 is formed by, for example, a spin coating method, but the coating method of the dielectric layer 130 is not limited. Furthermore, the dielectric layer 130 may be formed of one selected from the group consisting of Poly Benz Oxazole(PBO), PolyImide (PI), Benzo Cyclo Butene(BCB), BismaleimideTriazine (BT), phenolic resin, epoxy, Silicone, and equivalents thereof, but the material of the dielectric layer 130 is not limited thereto.

As the dielectric layer 130 is formed in the above manner, the thickness of the dielectric layer 130 becomes greater than the length (or thickness) of the through electrode 120 extending and protruding from the first surface 111 of the semiconductor die 110.

Figure 4D:
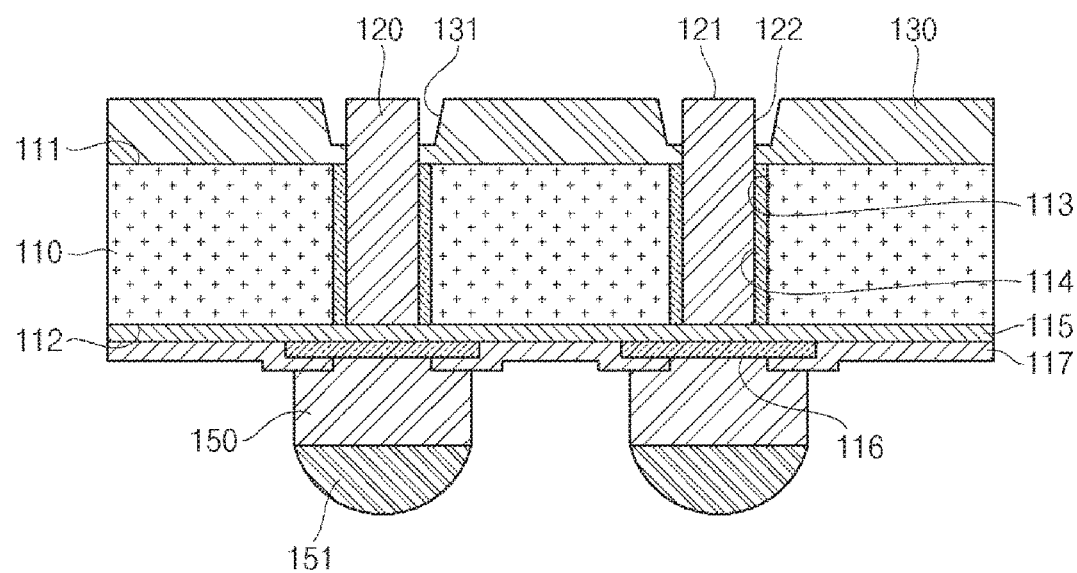

As shown in FIG. 4D, in the forming an opening, the dielectric layer 130 is removed partially corresponding to the through electrode 120, thus forming an opening 131 with a predetermined depth and width. For example, a mask is formed on a portion of the dielectric layer 130 not corresponding to the through electrode 120, and is not formed on the other portion of the dielectric layer 130 which does corresponding to the through electrode 120.

In this state, by partially removing the dielectric layer 130 using wet etching or dry etching, the opening 131 with a predetermined depth and width is formed. Here, the opening 131 has an inclined shape. That is, the opening 131 has a narrower lower region and is widened toward its upper region. Of course, the through electrode 120, i.e., the exposed top surface 121 and both side surfaces 122, is exposed to the outside through the opening 131.

Figure 4E:
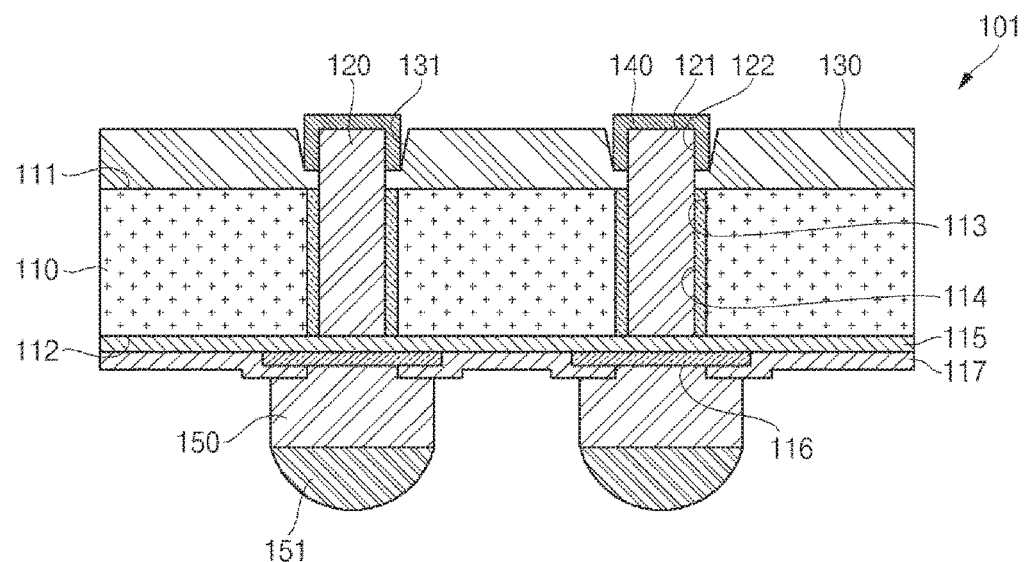

As shown in FIG. 4E, in the forming a conductive pad, a conductive pad 140 is formed on the through electrode 120, extending and protruding through the opening 131, by an electroless plating method. The conductive pad 140 includes a first electroless plating layer 141, a second electroplating layer 142, and a third electroplating layer 143 as described above.

The first electroless plating layer 141 is formed to surround the through electrode 120. Furthermore, the second electroless plating layer 142 roughly covers the first electroless plating layer 141. Also, the third electroless plating layer 143 roughly covers the second electroless plating layer 142.

Furthermore, the first electroless plating layer 141 may be formed of nickel or equivalents thereof. Also, the second electroless plating layer 142 may be formed of palladium or equivalents thereof. Furthermore, the third electroless plating layer 143 may be formed of gold or equivalents thereof. Here, the second electroless plating layer 142 may not be formed in some cases.

Since the conductive pad 140 is formed by an electroless plating method as described above, there is no need for seed metal, as well as a high-temperature sputtering process for the formation of seed metal.

In another embodiment, referring back to FIGS. 2 and 4C together, after the dielectric layer 130 (FIG. 4C) is formed, the entirety of the top surface of the dielectric layer 130 is dry- or wet-etched by using the blanket process to form the dielectric layer 230 (FIG. 2), thus causing the through electrode 120 to protrude, and subsequently the conductive pad 240 is formed on the through electrode 120. In such a manner, the semiconductor device 201 shown in FIG. 2 is obtained through wet or dry etching.

In yet another embodiment, referring back to FIGS. 3 and 4C together, after the dielectric layer 130 (FIG. 4C) is formed, the entirety of the top surface of the dielectric layer 130 is subjected to grinding by using a CMP process to form the dielectric layer 330 (FIG. 3), thus exposing the through electrode 120, and subsequently, the conductive pad 340 is formed on the through electrode 120. In such a manner, the semiconductor device 301 shown in FIG. 3 is obtained.

Figure 5:
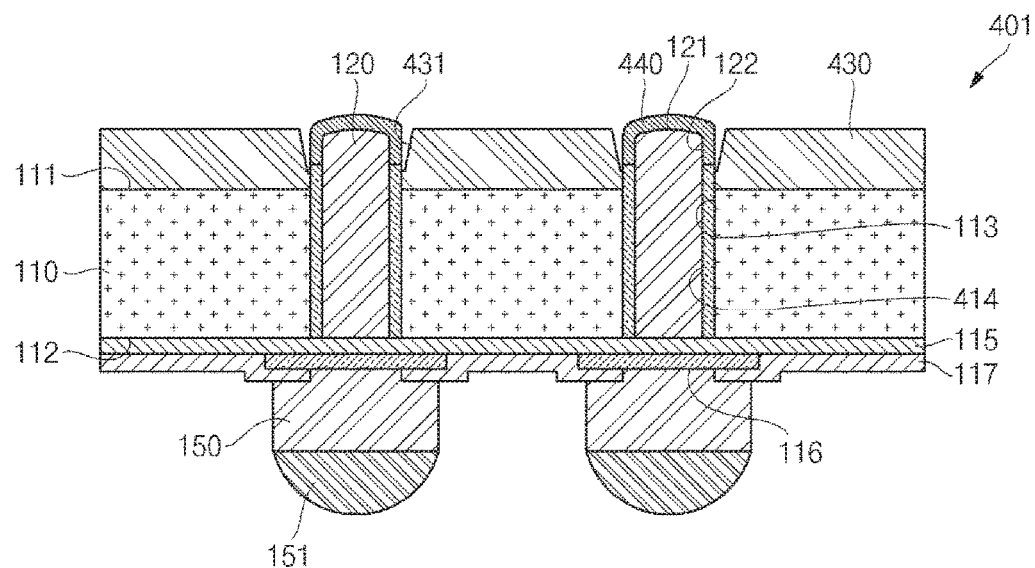
FIG. 5 illustrates a cross-sectional view of a semiconductor device according to another embodiment.

Referring to FIG. 5, a cross-sectional view of a semiconductor device 401 according to another embodiment is illustrated. As shown in FIG. 5, the semiconductor device 401 according to another embodiment is similar to the semiconductor device 101 shown in FIG. 1A, and thus only the significant differences will now be described.

An insulating layer 414 surrounding the through electrode 120 may extend not only between the first surface 111 and the second surface 112 of the semiconductor die 110 as in FIG. 1A but also to an opening 431 in a dielectric layer 430. That is, the insulating layer 414 extends upwardly to a predetermined length through the first surface 111 of the semiconductor die 110, and thus is interposed between the dielectric layer 430 and the through electrode 120. In the above manner, the dielectric layer 430 contacts the insulating layer 414, rather than the through electrode 120.

Furthermore, a conductive pad 440 may be disposed on the through electrode 120 outside the insulating layer 414. That is, the conductive pad 440 is formed on the top surface 121 and both side surfaces 122 of the through electrode 120 protruding through the insulating layer 414, and the thickness of the conductive pad 440 may be almost similar to the thickness of the insulating layer 414, but the thickness of the conductive pad 440 is not limited thereto. Here, the top surface 121 of the through electrode 120 is not planar but substantially curved.

In such a manner, according to this embodiment, the through electrode 120 does not come into direct contact with the dielectric layer 430. That is, the insulating layer 414 is further interposed between the through electrode 120 and the dielectric layer 430. Accordingly, insulating properties for the through electrode 120 are more enhanced.

Figure 6:
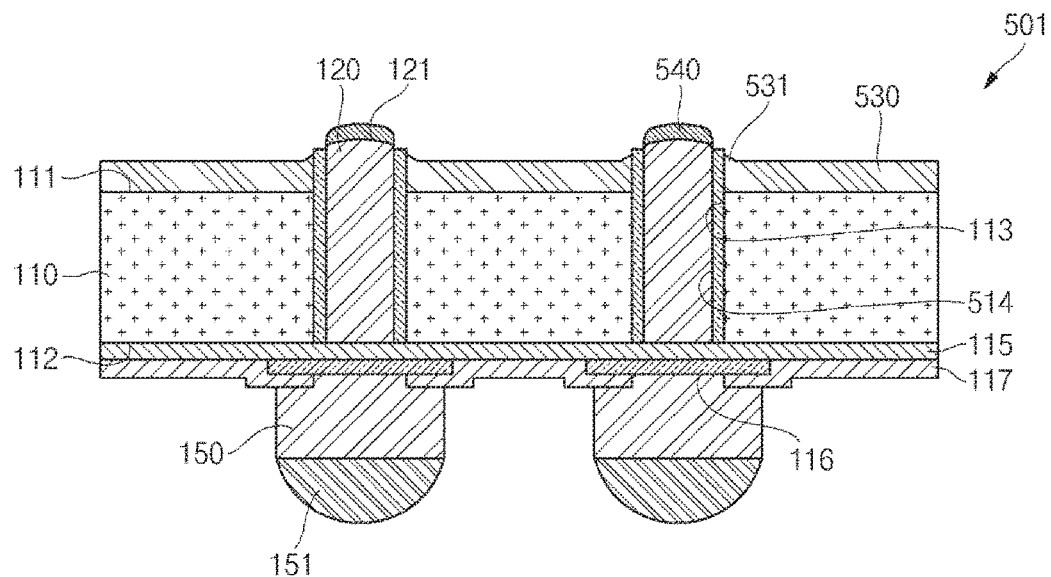
FIG. 6 illustrates a cross-sectional view of a semiconductor device according to another embodiment.

Referring to FIG. 6, a cross-sectional view of a semiconductor device 501 according to another embodiment is illustrated. As shown in FIG. 6, the semiconductor device 501 according to this embodiment is similar to the semiconductor device 201 shown in FIG. 2, and thus only the significant differences will now be described.

An insulating layer 514 fully covers both side portions, i.e., the entire sidewall, of the through electrode 120. That is, the insulating layer 514 is formed not only between the first surface 111 and the second surface 112 of the semiconductor die 110 but also between the through electrode 120 and a dielectric layer 530. In other words, the entirety of the outer cylindrical sidewall other than the top surface 121 of the through electrode 120 is covered with the insulating layer 514. Accordingly, the through electrode 120 and the dielectric layer 530 do not come into direct contact with each other. Also, the dielectric layer 530 formed around the insulating layer 514 may further include a projection 531 in a region corresponding to the through electrode 120.

Also, a conductive pad 540 is formed on only the top surface 121 of the through electrode 120 exposed through the insulating layer 514. Of course, as described above, the conductive pad 540 includes a first electroless plating layer, a second electroless plating layer, and a third electroless plating layer similar to the layers 141, 142, 143 described above. Here, the top surface 121 of the through electrode 120 is not planar but substantially curved.

The semiconductor device 501 is manufactured by applying a blanket process to the dielectric layer 530 to thus expose the through electrode 120, and applying a plating process to the top surface 121 of the exposed through electrode 120. Here, due to the blanket process, the dielectric layer 530 is the thickest in a region (the protrusion 531) corresponding to the through electrode 120, and becomes thinner as it is distanced from the through electrode 120.

Figure 7:
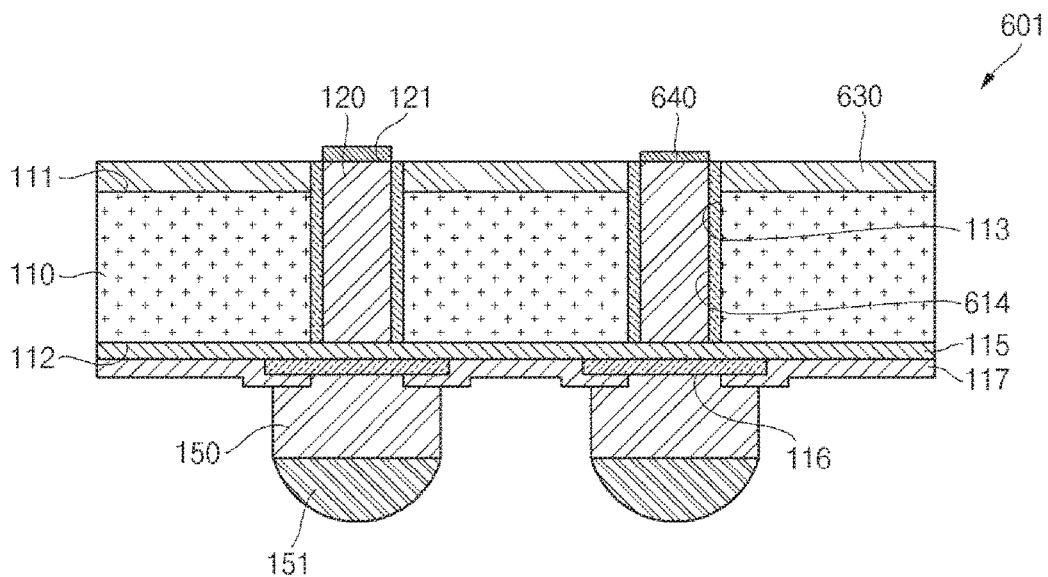
FIG. 7 illustrates a cross-sectional view of a semiconductor device according to another embodiment.

Referring to FIG. 7, a cross-sectional view of a semiconductor device 601 according to another embodiment is illustrated. As shown in FIG. 7, the semiconductor device 601 according to another embodiment is similar to the semiconductor device 201 shown in FIG. 2, and thus only the significant differences will now be described.

An insulating layer 614 fully covers the entire sidewall of the through electrode 120. Also, the respective top surfaces of the through electrode 120, the insulating layer 614 and a dielectric layer 630 are in the same plane. Thus, the through electrode 120 and the dielectric 630 do not come into directly contact with each other. Also, a conductive pad 640 is formed on only the top surface 121 of the through electrode 120 exposed through the insulating layer 614.

The semiconductor device 601 is manufactured by applying a CMP process to the dielectric layer 630 to thus expose the through electrode 120, and applying a plating process to the top surface 121 of the exposed through electrode 120. Here, due to the CMP process, the respective top surfaces 121 of the through electrode 120, the insulating layer 614 and the dielectric layer 630 are in the same plane. That is, the top surface 121 of the through electrode 120 has a substantially planar shape. Of course, due to the aforementioned process, the dielectric layer 630 does not have any opening or protrusion.

Referring to FIGS. 8A through 8E, a method of manufacturing the semiconductor device 401 of FIG. 5 according to one embodiment is illustrated. The method of manufacturing the semiconductor device 401 according to another embodiment includes forming a through electrode, etching a semiconductor die, forming a dielectric layer, forming an opening, and forming a conductive pad.

Figure 8A:
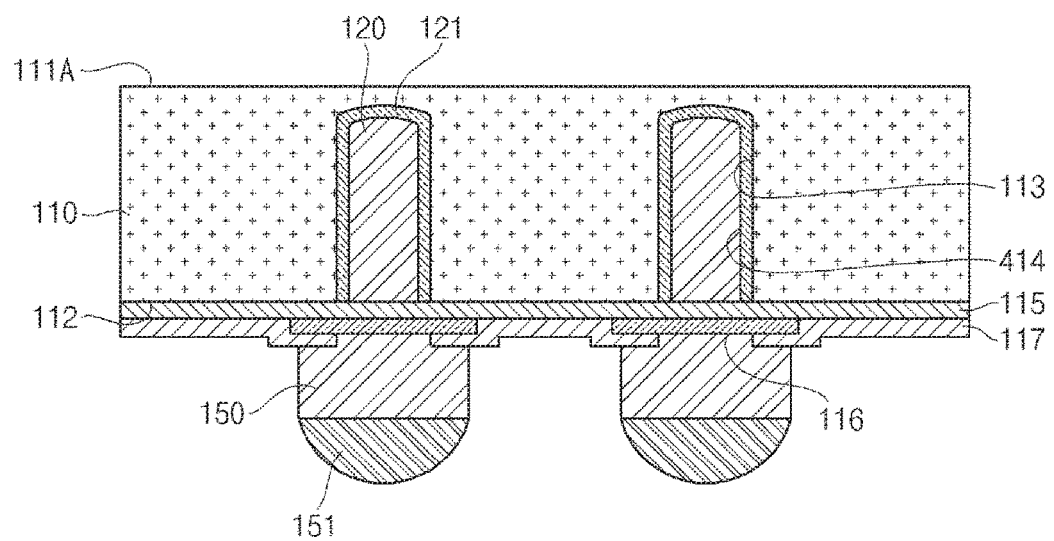
FIGS. 8A, 8B, 8C, 8D, and 8E illustrate sequential cross-sectional views of a method of manufacturing a semiconductor device according to another embodiment.

As shown in FIG. 8A, in the forming a through electrode, a through hole 113 is formed in a semiconductor die 110 having a first surface 111A and a second surface 112 opposing the first surface 111A, an insulating layer 414 is formed on the inner wall of the through hole 113, and a through electrode 120 is then formed inside the insulating layer 414. In this case, the insulating layer 414 surrounds the top surface 121 and the entire sidewall of the through electrode 120.

Figure 8B:
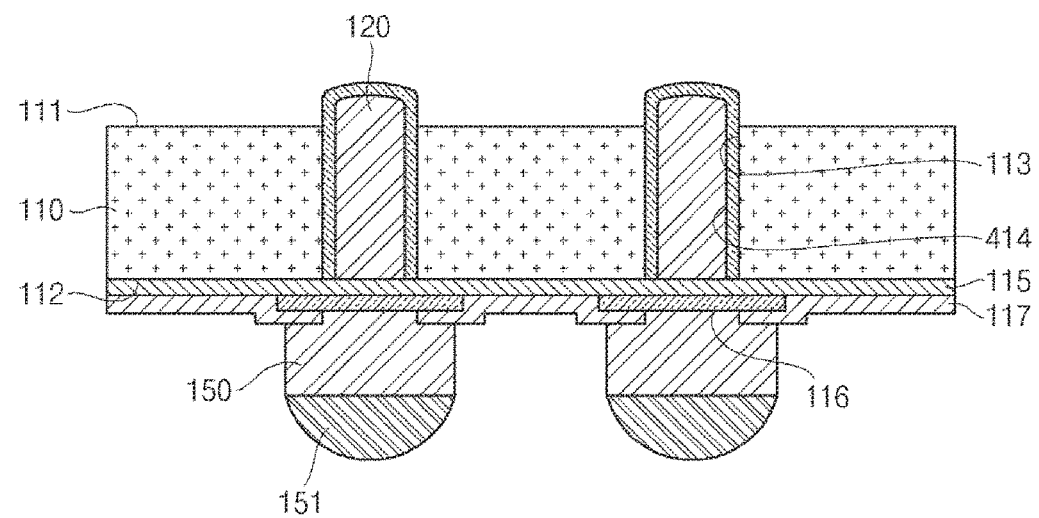

As shown in FIG. 8B, in the etching a semiconductor die, the first surface 111A of the semiconductor die 110 (FIG. 8A) is removed to a predetermined depth by wet etching or dry etching to form a first surface 111 (FIG. 8B). Here, an etchant used for the dry etching or the wet etching affects only the semiconductor die 110 and does not affect the insulating layer 414. By the etching process, the upper regions of the through electrode 120 and the insulating layer 414 extend and protrude upwardly to a predetermined length through the first surface 111 of the semiconductor die 110.

Figure 8C:
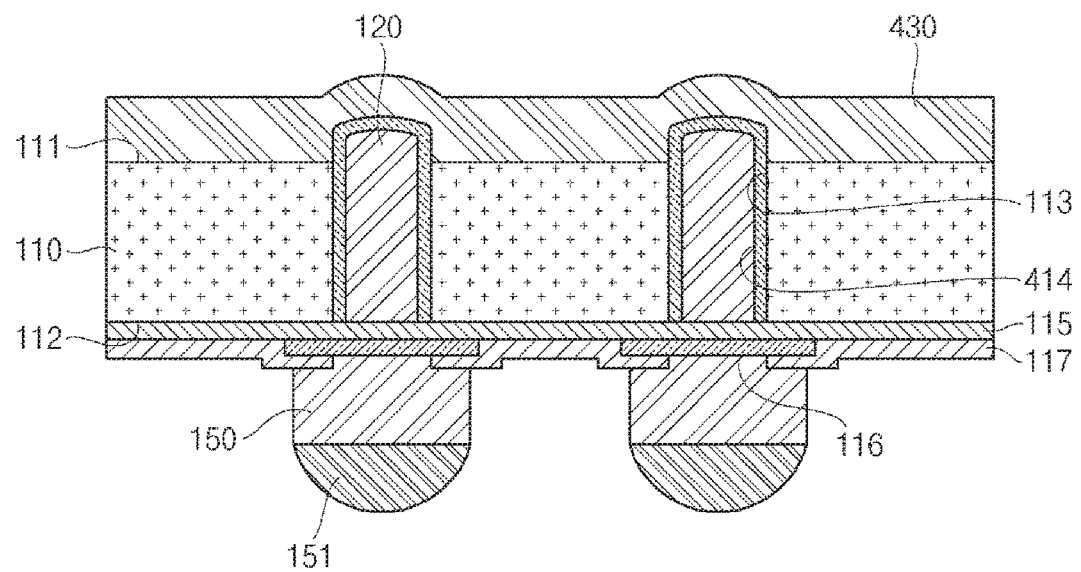

As shown in FIG. 8C, in the forming a dielectric layer, the first surface 111 of the semiconductor die 110 is coated with a dielectric layer 430 having a sufficient thickness to cover the insulating layer 414 formed on the surface of the through electrode 120.

Figure 8D:
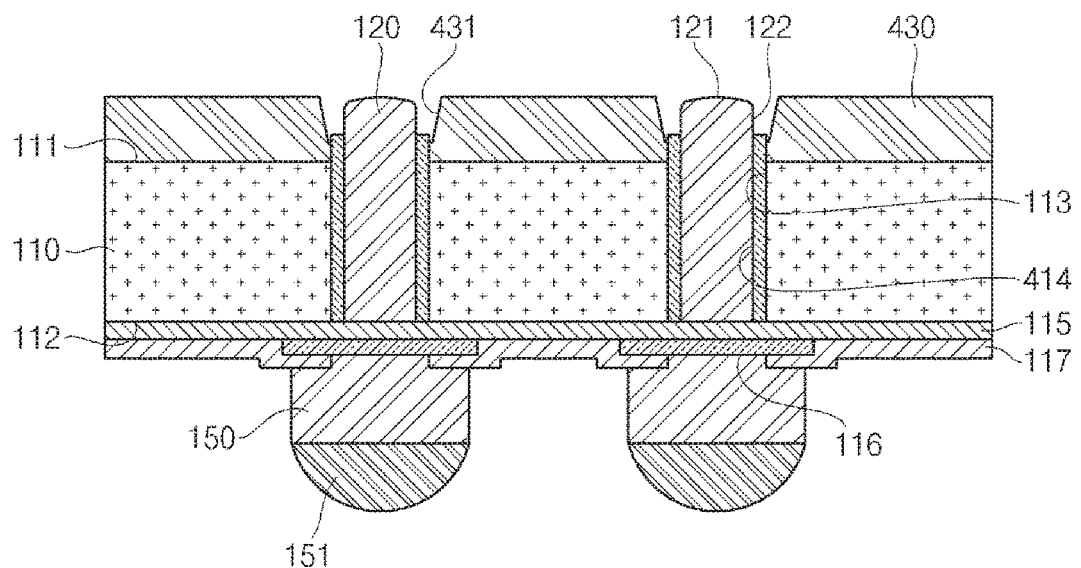

As shown in FIG. 8D, in the forming an opening, a portion of the dielectric layer 430 corresponding to the through electrode 120 is removed to thus form an opening 431 having a predetermined depth and width. At this time, the insulating layer 414 formed on the through electrode 120 is also removed. That is, the insulating layer 414 formed in a region corresponding to the through electrode 120 exposed through the opening 431 is also removed. Accordingly, the through electrode 120 without the insulating layer 414 is exposed to the outside through the opening 431. However, even in this state, the dielectric layer 430 is in contact with the insulating layer 414 without contacting the through electrode 120.

Figure 8E:
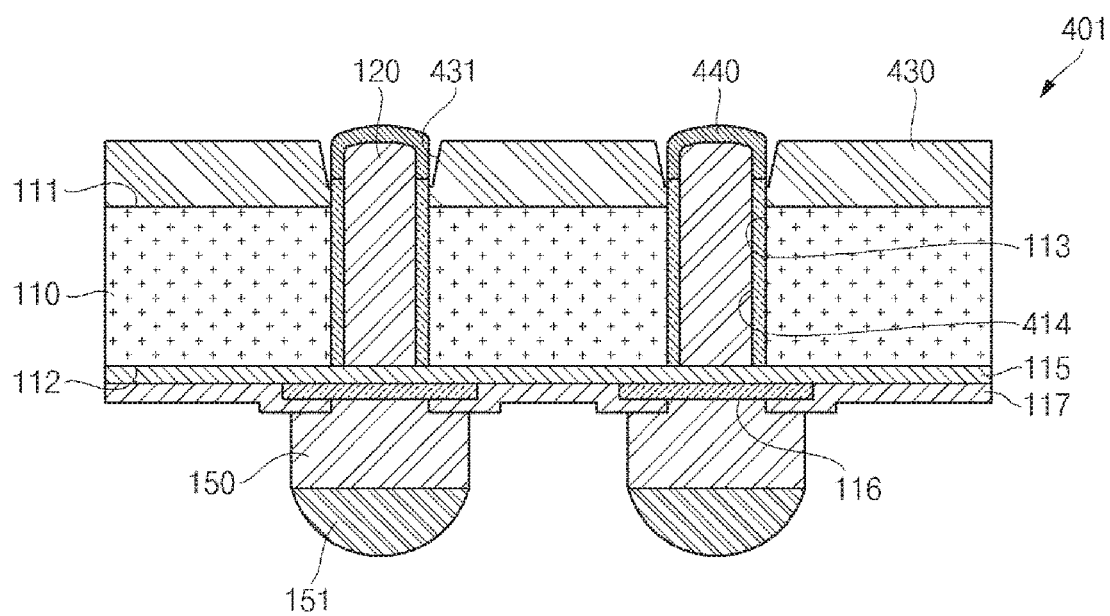

As shown in FIG. 8E, in the forming a conductive pad, a conductive pad 440 is formed on the through electrode 120 extending and protruding through the opening 431 by an electroless plating method. For example, a first electroless plating layer, a second electroless plating layer, and a third electroless plating layer as described above are sequentially formed to thus form the conductive pad 440. Of course, due to the aforementioned process, the conductive pad 440 can come into contact with the insulating layer 414 and/or the dielectric layer 430.

In another embodiment, referring back to FIGS. 6 and 8C together, after the dielectric layer 430 (FIG. 8C) is formed, the entirety of the top surface of the dielectric layer 430 and a portion of the insulating layer 414 are wet- or dry-etched by using a blanket process to form the dielectric layer 530 (FIG. 6) to thus cause the through electrode 120 to protrude, and subsequently, the conductive pad 540 is formed on the through electrode 120. In such a manner, the semiconductor device 501 shown in FIG. 6 is obtained.

In another embodiment, referring back to FIGS. 7 and 8C together, after the dielectric layer 430 (FIG. 8C) is formed, the entirety of the top surface of the dielectric layer 430 and a portion of the insulating layer 414 are subjected to grinding by using a CMP process to form the dielectric layer 630 (FIG. 7) to thus expose the through electrode 120, and subsequently, the conductive pad 640 is formed on the through electrode 120. In such a manner, the semiconductor device 601 shown in FIG. 7 is obtained.

Figure 9:
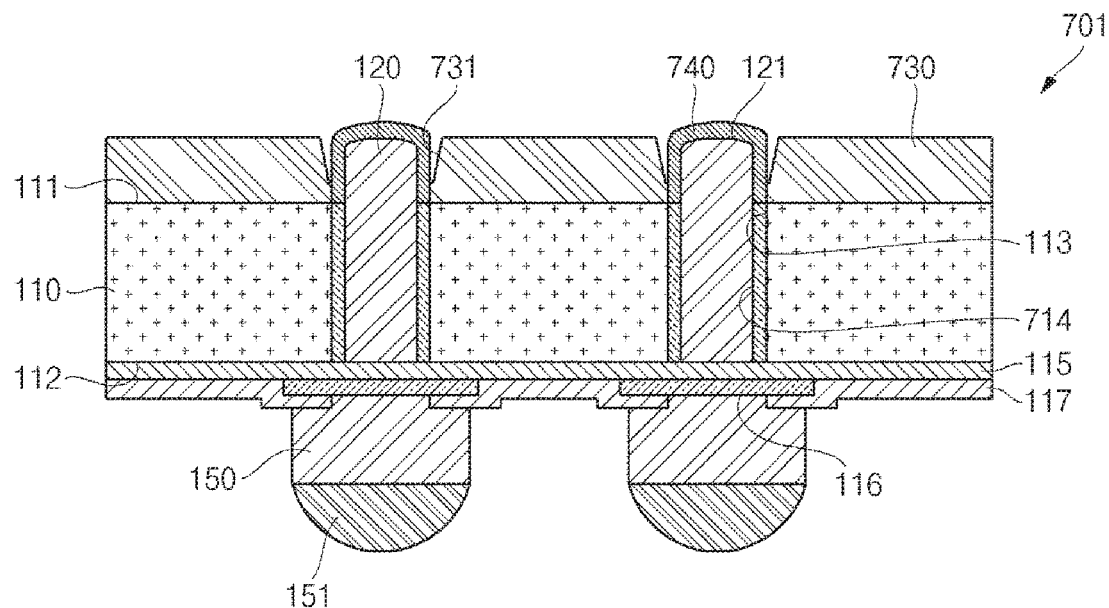
FIG. 9 illustrates a cross-sectional view of a semiconductor device according to another embodiment.

Referring to FIG. 9, a cross-sectional view of a semiconductor device 701 according to another embodiment is illustrated. As shown in FIG. 9, the semiconductor device 701 according to another embodiment is similar to the semiconductor device 101 shown in FIG. 1A, and only the significant differences will now be described.

As shown in FIG. 9, a conductive pad 740 is formed on the through electrode 120 protruding and extending through an opening 731 of a dielectric layer 730, and the conductive pad 740 contacts an insulating layer 714 surrounding the through electrode 120. Accordingly, substantially, the dielectric layer 730 does not come into contact with the through electrode 120, and contacts only the insulating layer 714 and the conductive pad 740. Here, the top surface 121 of the through electrode 120 is roughly curved shape, which is not planar.

Figure 10:
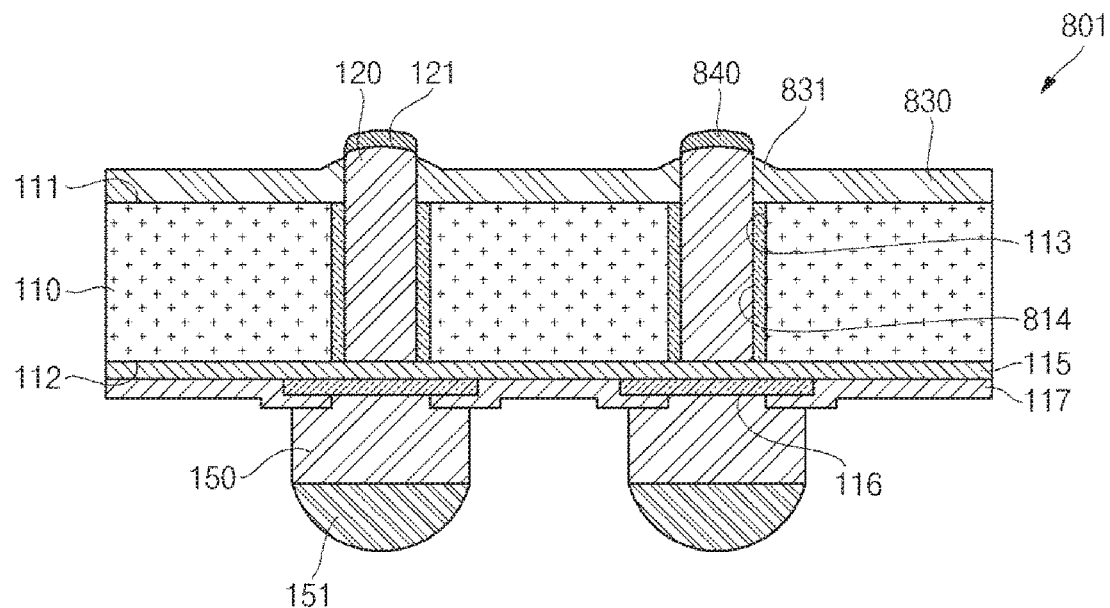
FIG. 10 illustrates a cross-sectional view of a semiconductor device according to another embodiment.

Referring to FIG. 10, a cross-sectional view of a semiconductor device 801 according to another embodiment is illustrated. As shown in FIG. 10, the semiconductor device 801 according to another embodiment is similar to the semiconductor device 201 shown in FIG. 2, and thus only the significant differences will now be described.

As shown in FIG. 10, the top surface 121 of the through electrode 120 is exposed through a dielectric layer 830. That is, the top surface 121 of the through electrode 120 is exposed through a protrusion 831 of the dielectric layer 830. Also, a conductive pad 840 is formed on the top surface 121 of the exposed through electrode 120. Accordingly, the conductive pad 840 slightly protrudes through the dielectric layer 830. Here, the top surface 121 of the through electrode 120 is not planar and has a substantially curved shape.

Referring to FIGS. 11A, 11B, 11C, 11D1, and 11E1, a method of manufacturing the semiconductor device 701 of FIG. 9 according to another embodiment is illustrated. The manufacturing method of the semiconductor device 701 according to another embodiment includes forming a through electrode, etching a semiconductor die, forming a dielectric layer, forming an opening, and forming a conductive pad.

Figure 11A:
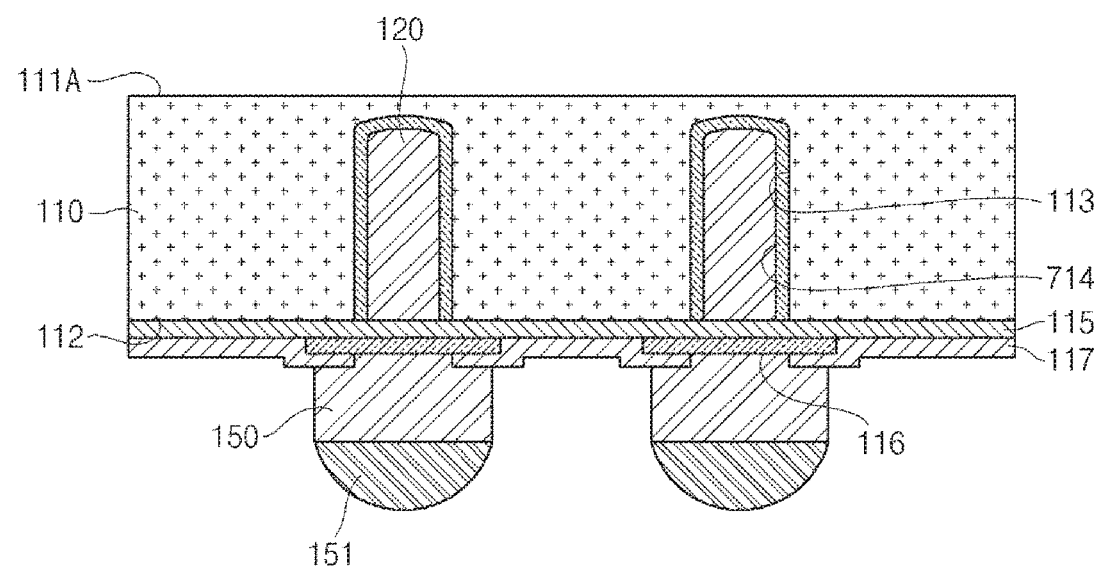

As shown in FIG. 11A, in the forming a through electrode, a through hole 113 is formed in a semiconductor die 110 having a first surface 111A and a second surface 112 opposing the first surface 111A, an insulating layer 714 is formed on the inner wall of the through hole 113, and a through electrode 120 is then formed inside the insulating layer 714. At this time, the insulating layer 714 surrounds the top surface 121 and the entire sidewall of the through electrode 120.

Figure 11B:
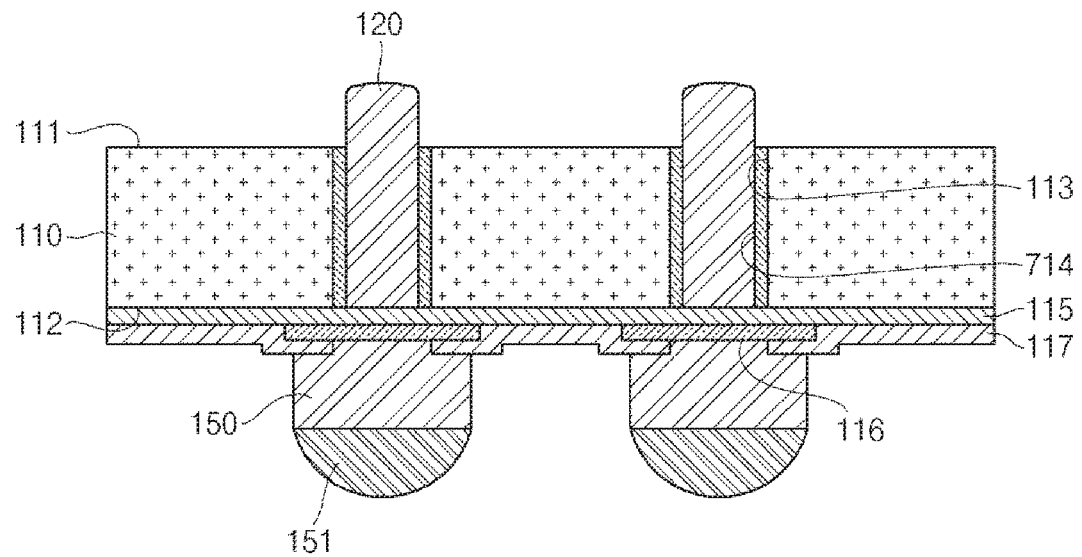

As shown in FIG. 11B, in the etching a semiconductor die, the first surface 111A of the semiconductor die 110 (FIG. 11A) is removed to a predetermined depth through wet etching or dry etching to form the first surface 111 as illustrated in FIG. 11B. An etchant used in the dry etching or the wet etching affects only the semiconductor die 110 and the insulating layer 714, and does not affect the through electrode 120. Accordingly, due to this etching process, the upper region of the through electrode 120 extends and protrudes upwardly to a predetermined length through the first surface 111 of the semiconductor die 110.

Figure 11C:
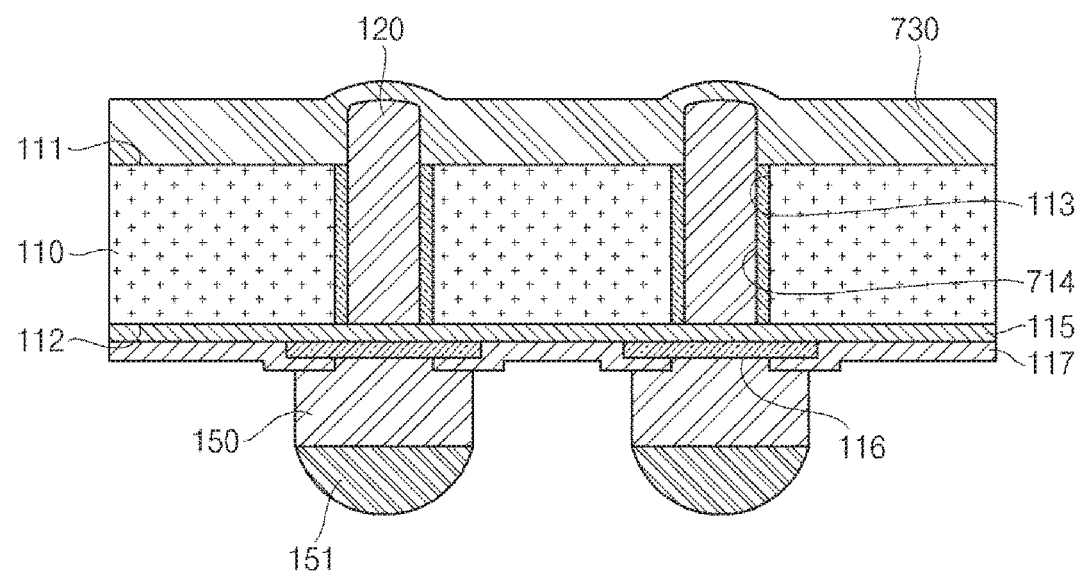

As shown in FIG. 11C, in the forming a dielectric layer, the first surface 111 of the semiconductor die 110 is coated with a dielectric layer 730 having a sufficient thickness to cover the through electrode 120.

As shown in FIG. 11D1, in the forming an opening, a portion of the dielectric layer 730 corresponding to the through electrode 120 is removed to thus form an opening 731 extending entirely thorough the dielectric layer 730 to expose the insulating layer 714. At this time, the through electrode 120 is exposed as well.

As shown in FIG. 11E1, in the forming a conductive pad, a conductive pad 740 is formed on the through electrode 120 extending and protruding through the opening 731 by using an electroless plating method. The conductive pad 740 extends entirely through the dielectric layer 730 to contact the insulating layer 714. Accordingly, substantially, the dielectric layer 730 does not come into contact with the through electrode 120, and contacts only the insulating layer 714 and the conductive pad 740.

FIGS. 11D2, 11E2 are cross-sectional views of the semiconductor device of FIG. 11C at later stages during fabrication in accordance with an alternative embodiment. As shown in FIG. 11D2, in the forming an opening, a portion of the dielectric layer 730 corresponding to the through electrode 120 is removed to thus form an opening 731. The opening 731 extends only partially, but not entirely, through the dielectric layer 730 such that a portion of the dielectric layer 730 remains above the insulating layer 714. At this time, the through electrode 120 is exposed as well.

As shown in FIG. 11E2, in the forming a conductive pad, a conductive pad 740 is formed on the through electrode 120 extending and protruding through the opening 731 by using an electroless plating method. The conductive pad 740 extends partially, but not entirely, through the dielectric layer 730 to be space apart from the insulating layer 714. Accordingly, substantially, a portion of the dielectric layer 730 does come into contact with the through electrode 120 between the insulating layer 714 and the conductive pad 740.

In accordance with yet another embodiment, referring back to FIGS. 10 and 11C, after the dielectric layer 730 (FIG. 11C) is formed, the entirety of the top surface of the dielectric layer 730 is wet- or dry-etched by using a blanket process to form the dielectric layer 830 (FIG. 10) to thus allow the through electrode 120 to protrude, and subsequently, the conductive pad 840 is formed on the through electrode 120. In this manner, the semiconductor device 801 shown in FIG. 10 is obtained.

In accordance with another embodiment, referring back to FIGS. 3 and 11C together, after the dielectric layer 730 (FIG. 11C) is formed, the entirety of the top surface of the dielectric layer 730 is subjected to grinding to form the dielectric layer 330 as illustrated in FIG. 3 to thus expose the through electrode 120, and subsequently, the conductive pad 340 is formed on the through electrode 120. In this manner, the semiconductor device 301 shown in FIG. 3 is obtained.

Figure 12:
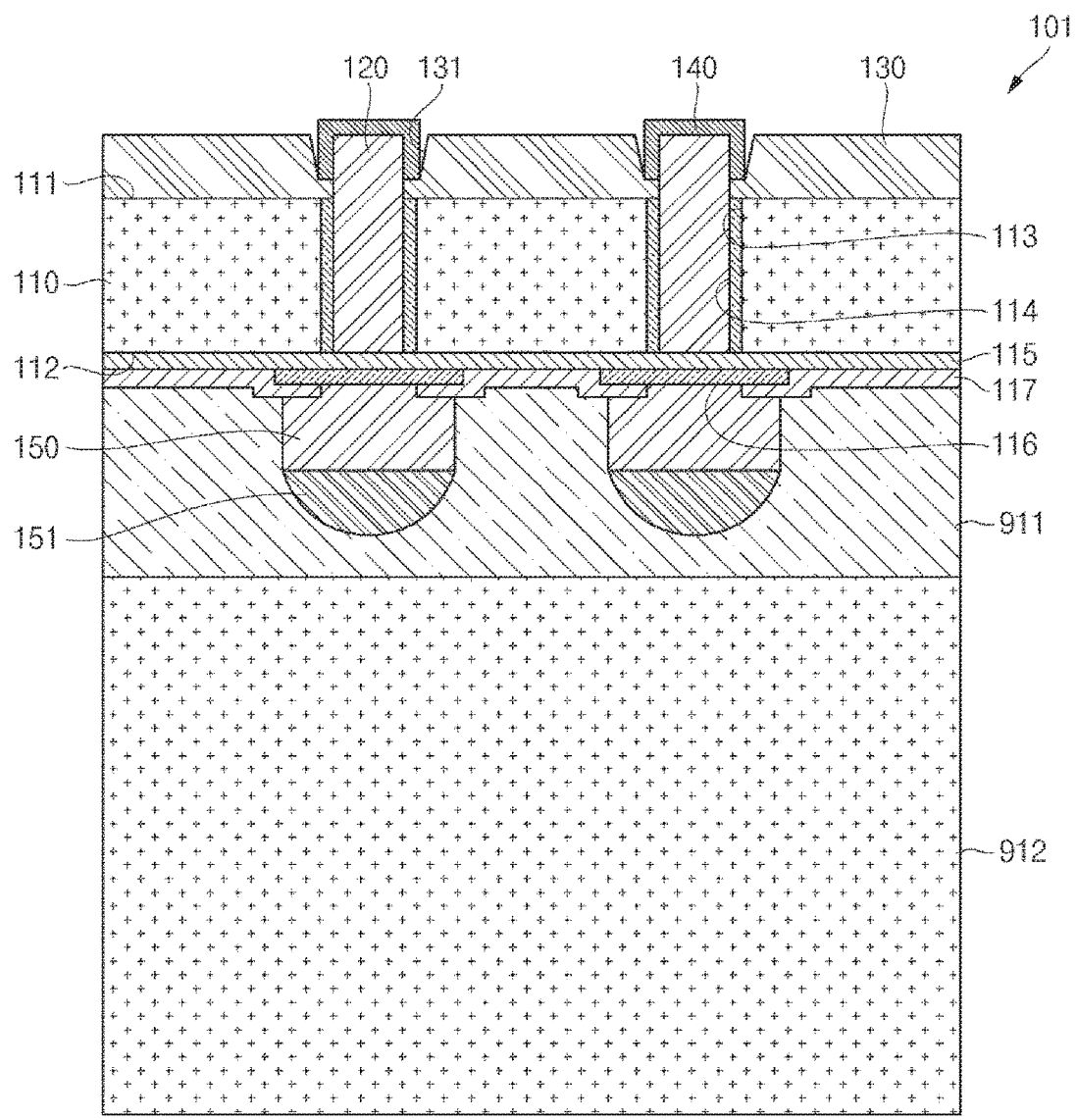
FIG. 12 illustrates a cross-sectional view to show a state in which a semiconductor device is bonded to a carrier wafer with a temporary bonding adhesive for a plating process of a method of manufacturing a semiconductor device.

Referring to FIG. 12, a state in which the semiconductor device 101 of FIG. 1A is bonded to a carrier wafer 912 by a temporary bonding adhesive 911 for a plating process of a manufacturing method of the semiconductor device 101 according to an embodiment is illustrated.

As shown in FIG. 12, in the manufacturing process of the semiconductor device 101, the semiconductor device 101 is bonded to a carrier wafer 912 by a temporary bonding adhesive 911. That is, the conductive bump 150, the solder cap 151, the insulating layer 117 of the semiconductor device 101 are bonded to the carrier wafer 912 by the temporary bonding adhesive 911.

Here, since the temporary bonding adhesive 911 has a low level of viscosity at a high-temperature process in general, the semiconductor device 101 is easily separated from the carrier wafer 912 in a high-temperature process. Furthermore, a gas generated from the temporary bonding adhesive 911 may cause cracking in the semiconductor device 101. That is, the temporary bonding adhesive 911 is not suitable for a high-temperature process such as existing sputtering.

However, according to embodiments, a low-temperature process such as plating is used rather than a high-temperature process such as sputtering, and thus the semiconductor device 101 is not easily separated from the carrier wafer 912 during a plating process. Also, the use of the low-temperature process does not cause gas generation from the temporary bonding adhesive 911, and prevents cracking in the semiconductor device 101.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:
1. A semiconductor device comprising:
  a semiconductor die comprising an inactive die side and an active die side opposite the inactive die side;
  a through hole in the semiconductor die that extends between the inactive die side and the active die side, the through hole comprising an inner wall;
  an insulating layer coupled to the inner wall of the through hole;
  a through electrode inside of the insulating layer;
  a dielectric layer coupled to the inactive die side; and
  a conductive pad coupled to the through electrode, wherein the through electrode passes completely through the dielectric layer, and the through electrode and the insulating layer extend a same distance from the inactive die side.

2. The semiconductor device of claim 1, wherein a first end surface of the through electrode and a first end surface of the insulating layer are co-planar.

3. The semiconductor device of claim 2, wherein a first surface of the dielectric layer is co-planar with the first end surface of the through electrode and the first end surface of the insulating layer.

4. The semiconductor device of claim 3, wherein a side of the conductive pad facing the through electrode and insulating layer is entirely planar.

5. The semiconductor device of claim 1, wherein the conductive pad contacts a first end of the through electrode, and comprising a second conductive pad coupled to a second end of the through electrode and positioned on the active die side.

6. The semiconductor device of claim 1, wherein the conductive pad comprises at least three metal layers.

7. The semiconductor device of claim 1, wherein the dielectric layer contacts the inactive die side.

8. The semiconductor device of claim 1, wherein the conductive pad extends laterally beyond the perimeter of a first end surface of the through electrode.

9. A semiconductor device comprising:
- a semiconductor die comprising a first die side and a second die side opposite the first die side;
- a through hole in the semiconductor die that extends between the first die side and the second die side, the through hole comprising an inner wall;
- an insulating layer coupled to the inner wall of the through hole;
- a through electrode inside of the insulating layer;
- a dielectric layer coupled to the first die side, wherein the dielectric layer directly contacts and surrounds the insulating layer; and
- a conductive pad coupled to a first end of the through electrode,
- wherein the through electrode passes completely through the dielectric layer, and a first end surface of the through electrode and a first surface of the dielectric layer are co-planar.

10. The semiconductor device of claim 9, wherein a first end surface of the insulating layer is co-planer with the first end surface of the through electrode and the first surface of the dielectric layer.

11. The semiconductor device of claim 9, wherein the first die side is an inactive side of the semiconductor die and the second die side is an active side of the semiconductor side.

12. The semiconductor device of claim 9, wherein the conductive pad comprises at least three metal layers.

13. The semiconductor device of claim 9, wherein a first side of the conductive pad faces the through electrode, is entirely planar, and has a larger diameter than the insulating layer.

14. A semiconductor device comprising:
- a semiconductor die comprising a first die side and a second die side opposite the first die side;
- a through hole in the semiconductor die that extends between the first die side and the second die side, the through hole comprising an inner wall;
- an insulating layer coupled to the inner wall of the through hole;
- a through electrode inside of the insulating layer;
- a dielectric layer coupled to the first die side;
- a first conductive pad coupled to a first end of the through electrode, wherein the first conductive pad comprises a plurality of metal layers; and
- a second conductive pad coupled to a second end of the through electrode,
- wherein the through electrode passes completely through the dielectric layer,
- and wherein the semiconductor die is the only semiconductor die of the semiconductor device.

15. The semiconductor device of claim 14, wherein the first conductive pad comprises at least three metal layers.

16. The semiconductor device of claim 15, wherein each of the at least three metal layers is different from the others.

17. The semiconductor device of claim 14, wherein the first conductive pad and the second conductive pad have different respective numbers of metal layers.

18. The semiconductor device of claim 14, comprising a second dielectric layer covering a circumference of the second conductive pad.

19. The semiconductor device of claim 18, comprising a conductive bump coupled to the second conductive pad, wherein at least a portion of the second dielectric layer is positioned directly between the conductive bump and the second conductive pad.

20. The semiconductor device of claim 19, comprising a solder cap on a second side of the conductive bump opposite a first side of the conductive bump that faces the second conductive pad.

* * * * *